(12) United States Patent
Hsu et al.

(10) Patent No.: US 10,636,360 B2
(45) Date of Patent: Apr. 28, 2020

(54) WIRELESS DISPLAY PANEL WITH MULTI-CHANNEL DATA TRANSMISSION AND DISPLAY DEVICE USING THE SAME

(71) Applicant: a.u. Vista, Inc., Irvine, CA (US)

(72) Inventors: Ching-Yi Hsu, Hsinchu (TW);
Yu-Sheng Huang, Hsinchu (TW);
Hsing-Yi Hsieh, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 0 days.

(21) Appl. No.: 16/278,578

(22) Filed: Feb. 18, 2019

(65) Prior Publication Data

US 2020/0020749 A1 Jan. 16, 2020

Related U.S. Application Data

(60) Provisional application No. 62/696,031, filed on Jul. 10, 2018.

(51) Int. Cl.
*G09G 3/3258* (2016.01)
*H01L 27/12* (2006.01)
(Continued)

(52) U.S. Cl.
CPC ......... *G09G 3/3258* (2013.01); *G02F 1/1368* (2013.01); *G02F 1/13452* (2013.01); *G02F 1/136286* (2013.01); *G09G 3/2003* (2013.01); *G09G 3/32* (2013.01); *G09G 3/3614* (2013.01); *G09G 3/3659* (2013.01); *G09G 3/3677* (2013.01); *H01L 25/167* (2013.01); *H01L 27/1218* (2013.01); *H01L 27/326* (2013.01); *H01L 27/3211* (2013.01); *H01L 27/3276* (2013.01); *H01Q 1/24* (2013.01);
(Continued)

(58) Field of Classification Search
None
See application file for complete search history.

(56) References Cited

U.S. PATENT DOCUMENTS 6,164,241 A 12/2000 Chen et al.
6,466,177 B1 10/2002 Kunysz
(Continued)

*Primary Examiner* — Nicholas J Lee
(74) *Attorney, Agent, or Firm* — Tim Tingkang Xia, Esq.; Locke Lord LLP

(57) ABSTRACT

A display panel includes a pixel structure, a receiver antenna structure and a transmitter antenna structure. The pixel structure includes multiple pixels arranged in an array. The receiver antenna structure provides first signals to the pixels, and includes multiple receiver antennas. Each receiver antenna has a resonance frequency. The transmitter antenna structure transmits wireless signals to the receiver antenna structure such that the receiver antenna structure generates the first signals, and includes multiple transmitter antennas. Each transmitter antenna one-to-one corresponds to one receiver antenna and has an identical resonance frequency. The receiver and transmitter antennas are correspondingly divided into multiple receiver and transmitter antenna loop groups, and each antenna loop group includes at least 3 antennas. The resonance frequencies of the receiver antennas of each receiver antenna loop group, in a sequence from an outermost receiver antenna toward an innermost receiver antenna, are not gradually increasing or gradually decreasing.

20 Claims, 32 Drawing Sheets

(51) Int. Cl.
  *H05K 1/02*  (2006.01)
  *H01Q 1/24*  (2006.01)
  *G02F 1/1345*  (2006.01)
  *G02F 1/1362*  (2006.01)
  *G02F 1/1368*  (2006.01)
  *G09G 3/32*  (2016.01)
  *G09G 3/36*  (2006.01)
  *H01L 25/16*  (2006.01)
  *G09G 3/20*  (2006.01)
  *H01L 27/32*  (2006.01)

(52) U.S. Cl.
  CPC ... *H05K 1/0213* (2013.01); *G09G 2300/0408* (2013.01); *G09G 2300/0426* (2013.01); *G09G 2300/0439* (2013.01); *G09G 2300/0814* (2013.01); *G09G 2300/0885* (2013.01); *G09G 2320/0219* (2013.01); *G09G 2370/16* (2013.01); *H01L 27/1255* (2013.01)

(56) References Cited

U.S. PATENT DOCUMENTS

| | | |
|---|---|---|
| 6,885,344 B2 | 4/2005 | Mohamadi |
| 8,474,726 B2 | 7/2013 | Finn |
| 2018/0190182 A1* | 7/2018 | Li .......................... G09G 3/22 |

* cited by examiner

WIRELESS DISPLAY PANEL WITH MULTI-CHANNEL DATA TRANSMISSION AND DISPLAY DEVICE USING THE SAME

CROSS-REFERENCE TO RELATED PATENT APPLICATION

This non-provisional application claims priority to and the benefit of, pursuant to 35 U.S.C. § 119(e), U.S. provisional patent application Ser. No. 62/696,031 filed Jul. 10, 2018. The disclosure of the above application is incorporated herein in its entirety by reference.

FIELD

The disclosure relates generally to display technology, and more particularly to a wireless display panel having an antenna layer design for multi-channel data transmission and display devices using the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Generally, a display panel may include a peripheral non-display area, which is reserved for a plurality of integrated circuits (ICs), as the data drivers that provide data signals to the pixels of the display panel. In order to reduce or eliminate the peripheral non-display area, wireless transmission technology may be used to transmit the data signals, thus achieving high speed data transmission. For example, a wireless display device may include a transmitter antenna structure and a receiver antenna structure correspondingly provided, with the transmitter antenna structure having one or more transmitter antennas Tx and the receiver antenna structure having one or more receiver antennas Rx, thus forming one or more wireless data transmission pairs Tx-Rx. However, when multiple wireless data transmission pairs Tx-Rx are formed in a wireless display device, the wireless data transmission between the wireless data transmission pairs Tx-Rx may interfere with one another, which negatively affects the transmission performances for some of the wireless data transmission pairs Tx-Rx.

Therefore, a heretofore unaddressed need exists in the art to address the aforementioned deficiencies and inadequacies.

SUMMARY

One aspect of the disclosure relates to a display panel, which includes: a pixel structure corresponding to a display area, comprising a plurality of pixels arranged in an array having M columns and N rows, wherein M and N are positive integers; a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas; wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3; wherein the P receiver antennas of each of the receiver antenna loop groups are arranged to be concentric, and the P transmitter antennas of the corresponding one of the transmitter antenna loop groups are arranged to be concentric; wherein the resonance frequencies of the P receiver antennas of each of the receiver antenna loop groups, in a sequence from an outermost receiver antenna toward an innermost receiver antenna, are not gradually increasing or gradually decreasing; and wherein each of the receiver antennas has a feeding end, and the feeding ends of the P receiver antennas of each of the receiver antenna loop groups are not adjacent to one another.

In certain embodiments, the pixel structure further comprises a plurality of data lines, each of the receiver antennas is electrically connected to one of the data lines at the feeding end thereof, and each of the pixels in a same column of the M columns of the pixel array is connected to a same one of the data lines.

In certain embodiments, the pixel structure comprises a black matrix area, and each of the receiver antennas is arranged to be substantially aligned to the black matrix area of the pixel structure along a vertical direction perpendicular to the pixel structure.

In certain embodiments, for the P receiver antennas of each of the receiver antenna loop groups, the feeding ends of two of the P receiver antennas are located at different corners of the receiver antennas.

In certain embodiments, for the P receiver antennas of each of the receiver antenna loop groups, the feeding end of one of the P receiver antennas is an outer feeding end, and the feeding end of another one of the P receiver antennas is an inner feeding end.

In certain embodiments, P=4, and the four receiver antennas of each of receiver antenna loop groups comprises, in the sequence from the outermost receiver antenna toward the innermost receiver antenna: a first receiver antenna; a second receiver antenna; a third receiver antenna; a fourth receiver antenna; wherein the resonance frequency of the first receiver antenna is less than the resonance frequencies of the second, third and fourth receiver antennas.

In certain embodiments, the resonance frequency of the second receiver antenna is greater than the resonance frequency of one of the third and fourth receiver antennas, and is less than the resonance frequency of the other of the third and fourth receiver antennas.

In certain embodiments, the feeding ends of the first, second, third and fourth receiver antennas are located at a same corner of the receiver antennas, and at least one of the feeding ends of the first, second, third and fourth receiver antennas is an outer feeding end, and at least one of the feeding ends of the first, second, third and fourth receiver antennas is an inner feeding end.

In certain embodiments, the feeding ends of the first and third receiver antennas are located at a first corner of the receiver antennas, and the feeding ends of the second and fourth receiver antennas are located at a second corner of the receiver antennas.

In certain embodiments, the feeding ends of the first and third receiver antennas are located at a first corner of the receiver antennas, the feeding end of the second receiver antenna is located at a second corner of the receiver antennas, and the feeding end of the fourth receiver antenna is located at a third corner of the receiver antennas.

Another aspect of the disclosure relates to a display panel, which includes: a pixel structure corresponding to a display area, comprising a plurality of pixels arranged in an array having M columns and N rows, wherein M and N are positive integers; a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas; wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3; wherein the P receiver antennas of each of the receiver antenna loop groups are arranged to be concentric; wherein the resonance frequencies of the P receiver antennas of each of the receiver antenna loop groups, in a sequence from an outermost receiver antenna toward an innermost receiver antenna, are not gradually increasing or gradually decreasing; and wherein each of the receiver antennas has a feeding end, and the feeding ends of the P receiver antennas of each of the receiver antenna loop groups are not adjacent to one another.

In certain embodiments, the pixel structure further comprises a plurality of data lines, each of the receiver antennas is electrically connected to one of the data lines at the feeding end thereof, and each of the pixels in a same column of the M columns of the pixel array is connected to a same one of the data lines.

In certain embodiments, the pixel structure comprises a black matrix area, and each of the receiver antennas is arranged to be substantially aligned to the black matrix area of the pixel structure along a vertical direction perpendicular to the pixel structure.

In certain embodiments, for the P receiver antennas of each of the receiver antenna loop groups, the feeding ends of two of the P receiver antennas are located at different corners of the receiver antennas.

In certain embodiments, for the P receiver antennas of each of the receiver antenna loop groups, the feeding end of one of the P receiver antennas is an outer feeding end, and the feeding end of another one of the P receiver antennas is an inner feeding end.

In certain embodiments, the P receiver antennas of each of the transmitter antenna loop groups are arranged in a tile pattern.

In a further aspect of the disclosure, a display panel includes: a pixel structure corresponding to a display area, comprising a plurality of pixels arranged in an array having M columns and N rows, wherein M and N are positive integers; a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas; wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3; wherein the P receiver antennas of each of the transmitter antenna loop groups are arranged to be concentric; wherein the resonance frequencies of the P transmitter antennas of each of the transmitter antenna loop groups, in a sequence from an outermost transmitter antenna toward an innermost transmitter antenna, are not gradually increasing or gradually decreasing; and wherein each of the receiver antennas has a feeding end, and the feeding ends of the P receiver antennas of each of the receiver antenna loop groups are not adjacent to one another.

In certain embodiments, the pixel structure further comprises a plurality of data lines, each of the receiver antennas is electrically connected to one of the data lines at the feeding end thereof, and each of the pixels in a same column of the M columns of the pixel array is connected to a same one of the data lines.

In certain embodiments, the pixel structure comprises a black matrix area, and each of the receiver antennas is arranged to be substantially aligned to the black matrix area of the pixel structure along a vertical direction perpendicular to the pixel structure.

In certain embodiments, the P receiver antennas of each of the receiver antenna loop groups are arranged in a tile pattern.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1A:
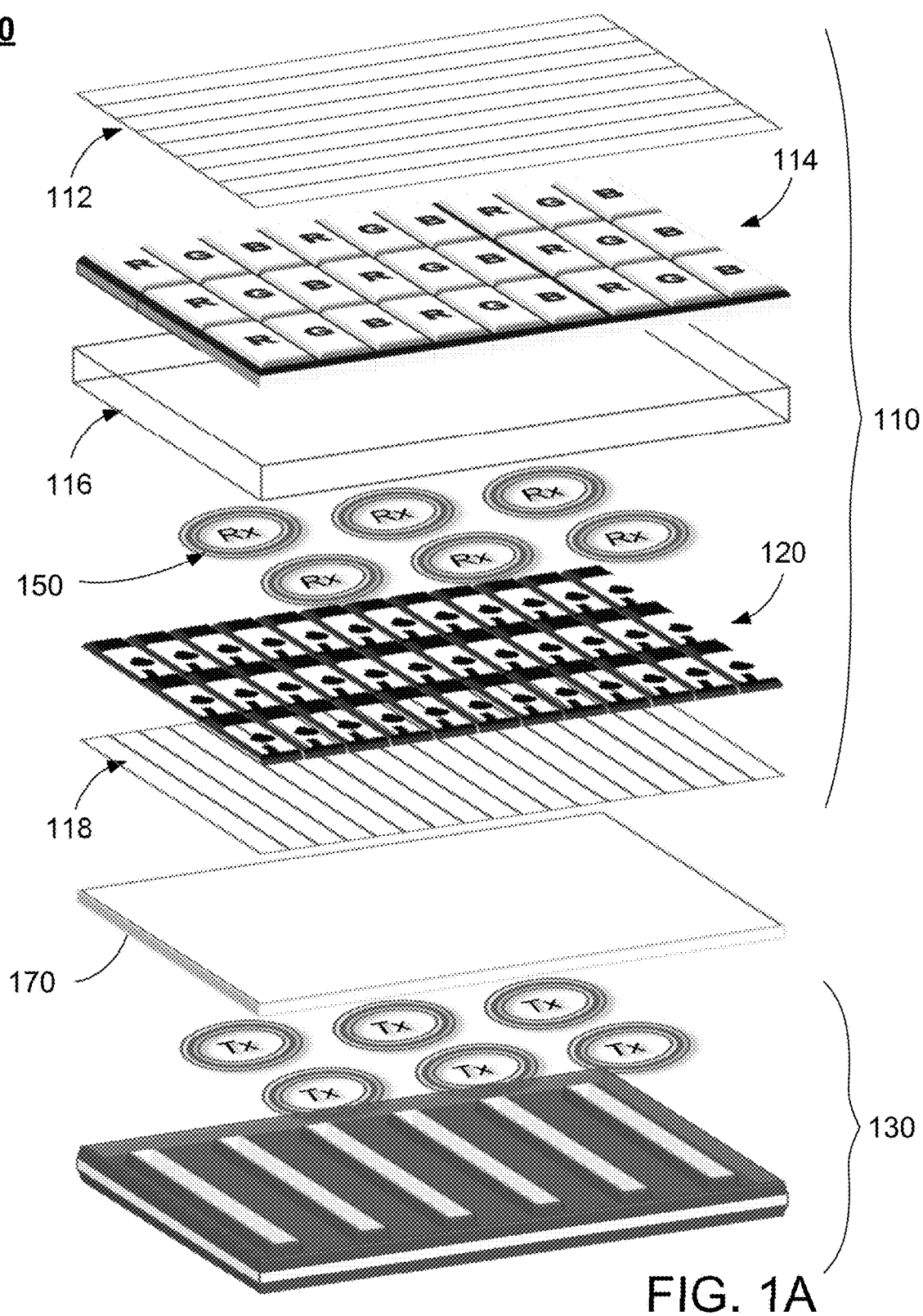
FIG. 1A schematically shows an exploded view of a display panel of a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the "feeding end" of a receiver antenna refers to the "actual" feeding end being electrically connected to a corresponding signal line. Generally, a receiver antenna has an outer feeding end and an inner feeding end, where one of the outer feeding end and the inner feeding end serves as the "feeding end" and the other of the outer feeding end and the inner feeding end is grounded or electrically connected to a reference voltage level (such as the common voltage $V_{COM}$ provided by a common electrode). In a certain embodiment, the inner feeding end is electrically connected to the common electrode through a through hole.

As used herein, the feeding ends of two receiver antennas are considered being "adjacent" to each other when (1) both the feeding ends are located at the same corner of the receiver antennas; (2) both the feeding ends are outer feeding ends, or both the feeding ends are inner feeding ends; and (3) no segment of receiver antennas exists between the feeding ends. Thus, in certain embodiments, the feeding ends of two receiver antennas are considered not being adjacent to each other when the feeding end of one receiver antenna is its outer feeding end and the feeding end of the other receiver antenna is its inner feeding end. In certain embodiments, the feeding ends of two receiver antennas are considered not being adjacent to each other when the feeding ends of the two receiver antennas are located at different corners of the receiver antennas. In certain embodiments, the feeding ends of two receiver antennas are considered not being adjacent to each other when at least one segment of the receiver antennas exists between the feeding ends of the two receiver antennas.

The description will be made as to the embodiments of the present disclosure in conjunction with the accompanying drawings. In accordance with the purposes of this disclosure, as embodied and broadly described herein, this disclosure, in certain aspects, relates to a wireless display panel with multi-channel data transmission and a display device using the same.

FIG. 1A schematically shows an exploded view of a display panel according to certain embodiments of the present disclosure. As shown in FIG. 1A, the display panel 100 is a color liquid crystal display (LCD) panel, which includes a display cell 110, a transmitter antenna structure 130, a receiver antenna structure 150 and a backlight module 170. The display cell 110 includes, from the image display side (top side of FIG. 1) toward a backlight side (bottom side of FIG. 1), a first polarizer 112, a color filter layer 114, a liquid crystal layer 116, a thin-film transistor (TFT) array 120 and a second polarizer 118. The receiver antenna structure 150 is formed by a plurality of receiver antennas Rx and is disposed on the TFT array 120. The transmitter antenna structure 150 is formed by a plurality of transmitter antennas Tx and is disposed on the backlight module 170, such that the transmitter antenna structure 130 is spatially separated from the receiver antenna structure 150. In other words, a distance exists between the transmitter antenna structure 130 and the receiver antenna structure 150 to facilitate high speed wireless data transmission between the transmitter antenna structure 130 and the receiver antenna structure 150. Each of the transmitter antennas Tx one-to-one corresponds to one of the receiver antennas Rx, and each of the transmitter antennas Tx has an identical resonance frequency to the resonance frequency of the corresponding receiver antenna Rx.

In the display cell 110, the TFT array 120, the liquid crystal layer 116 and the color filter layer 114 correspondingly define a pixel structure, which corresponds to a display area of the display panel 100. Specifically, the pixel structure includes a plurality of pixels arranged in an array having M columns and N rows, where M and N are positive integers. For each pixel of the pixel structure, a corresponding TFT in the TFT array 120 and a corresponding set of color filters in the color filter layer 114 are provided.

In certain embodiments, the display panel 100 may include other layers or structures not shown in FIG. 1A. For example, multiple insulating films or layers may be provided in the pixel structure (i.e., the TFT array 120, the liquid crystal layer 116 and the color filter layer 114).

Figure 1B:
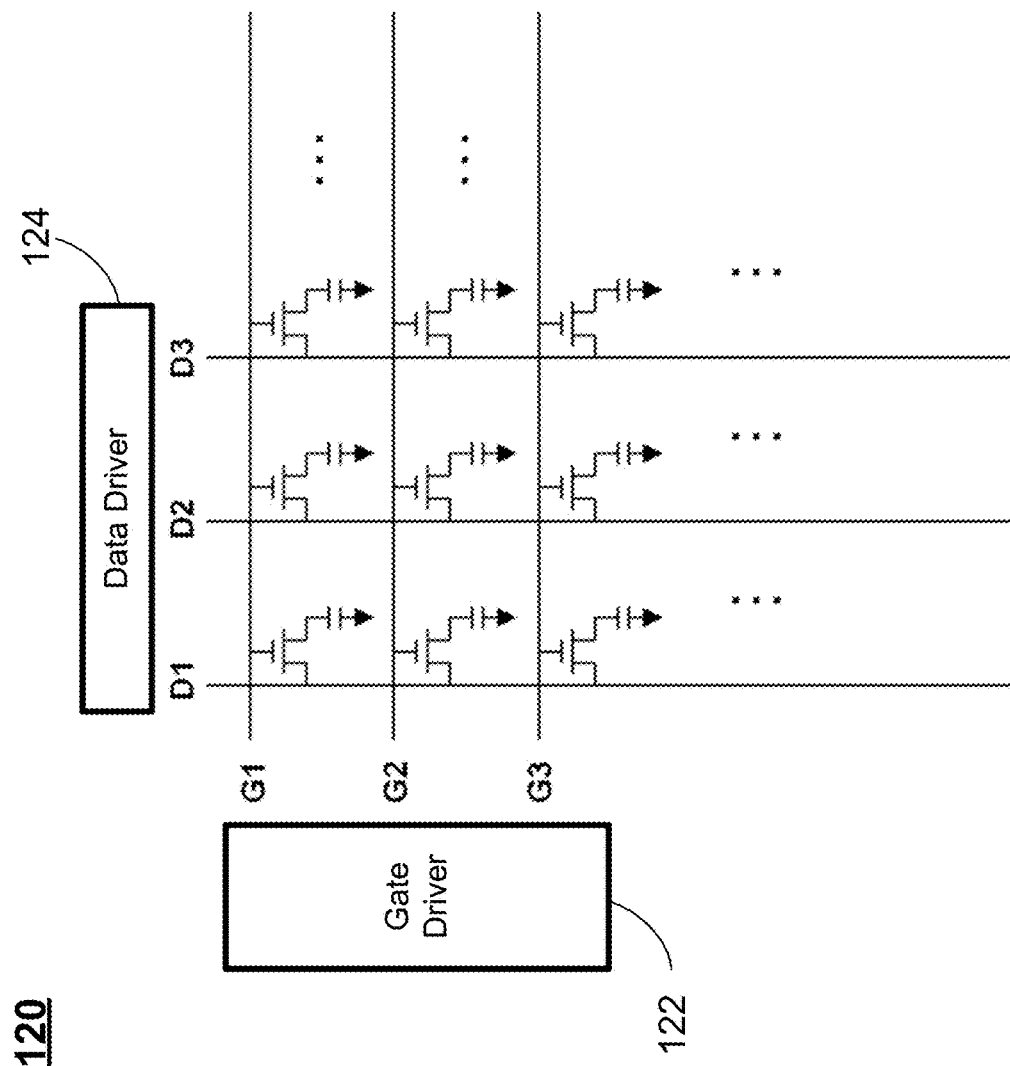
FIG. 1B schematically shows a part of a TFT array according to certain embodiments of the present disclosure.

FIG. 1B schematically shows a part of a TFT array according to certain embodiments of the present disclosure. As shown in FIG. 1B, the TFT array 120 includes a plurality of TFTs arranged in an array, where each of the TFT corresponds to a pixel of the pixel structure. In other words, for the pixel structure that includes a plurality of pixels arranged in an array having M columns and N rows, the TFT array 120 also includes a plurality of TFTs arranged in an array having M columns and N rows. Further, a plurality of data lines D1, D2, D3 . . . and a plurality of gate lines G1, G2, G3 . . . are provided in the pixel structure. Each of the data lines D1, D2, D3 is electrically connected to the sources of the TFTs in a corresponding column, and each of the gate lines G1, G2, G3 is electrically connected to the gates of the TFTs in a corresponding row. A gate driver 122 is connected to the gate lines G1, G2, G3 for providing gate signals to the gate lines, and a data driver 124 is connected to the data lines D1, D2, D3 for providing data signals to the data lines. In certain embodiments, the gate driver 122 and the data driver 124 are respectively provided at the border area of the display panel. In certain embodiments, multiple gate drivers 122 may be provided. In certain embodiments, multiple data drivers 124 may be provided.

Figure 2A:
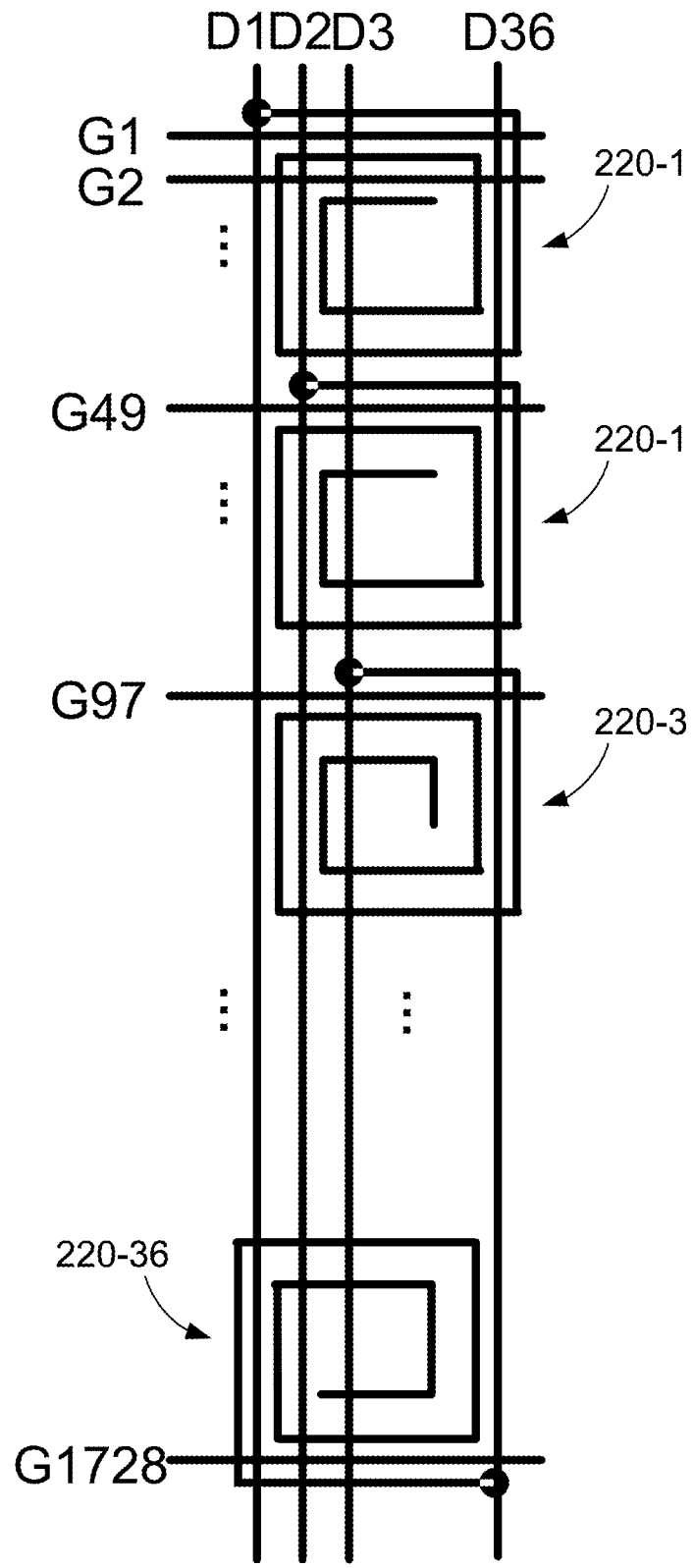
FIG. 2A schematically shows the connections between a row of receiver antennas in a receiver antenna structure and corresponding data lines in the pixel structure according to certain embodiments of the present disclosure.

FIG. 2A schematically shows the connections between a row of receiver antennas in a receiver antenna structure and corresponding data lines according to certain embodiments of the present disclosure. As shown in FIG. 2A, the pixel structure 200 includes 36 data lines D1 to D36 from left to right, and 1728 gate lines G1 to G1728 from top to bottom. Correspondingly, the receiver antenna structure includes 36 receiver antennas 220-1 to 220-36 arranged in a column. Each of the 36 data lines D1 to D36 is electrically connected to a corresponding one of the 36 receiver antennas 220-1 to 220-36 at the outer feeding end, and the inner feeding end of each of the 36 receiver antennas 220-1 to 220-36 is grounded. In other words, the number of the receiver antennas in a column is the same as the number of the corresponding data lines.

Figure 2B:
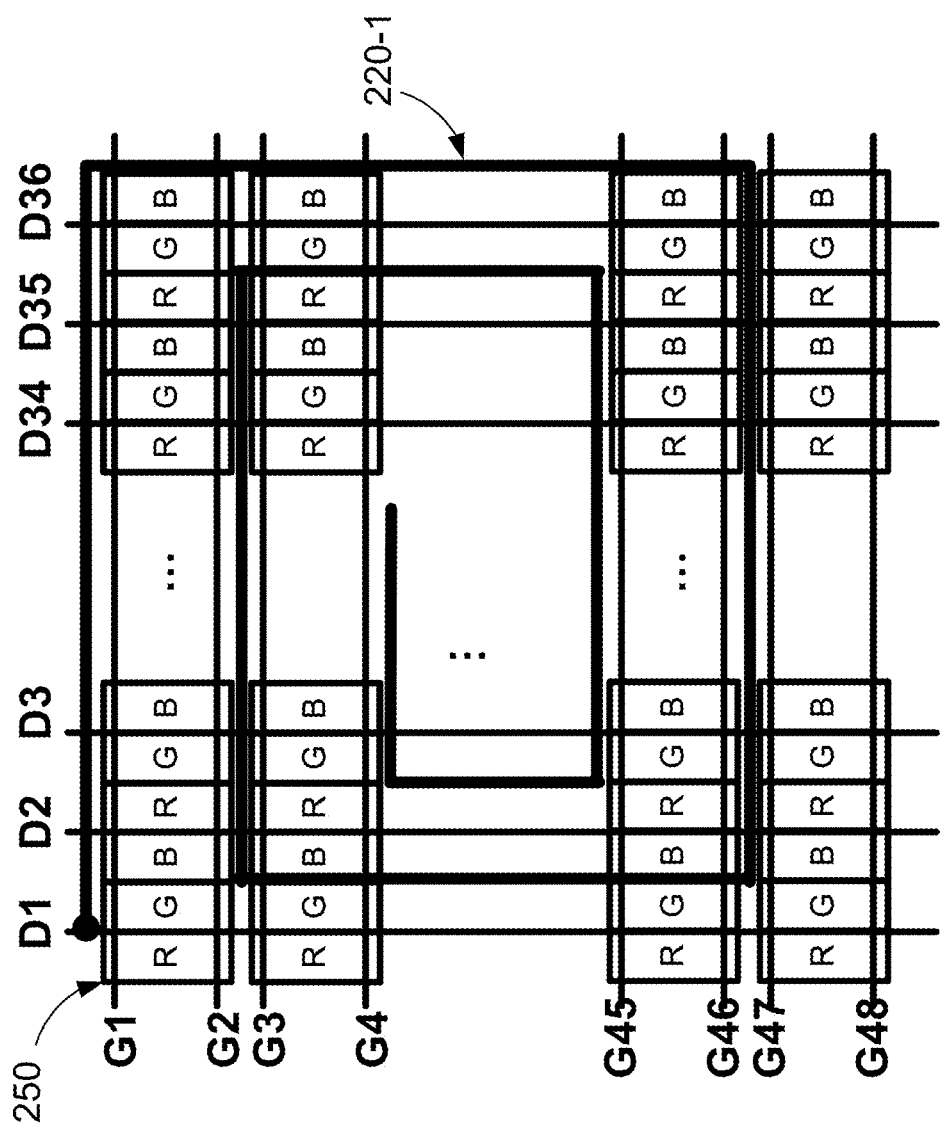
FIG. 2B schematically shows the location of one of the receiver antennas as shown in FIG. 2A according to certain embodiments of the present disclosure.

FIG. 2B schematically shows the location of one of the receiver antennas as shown in FIG. 2A. As shown in FIG. 2B, the horizontal segments of the receiver antenna 220-1 are respectively located between gate lines G1 to G48 and between two consecutive rows of the color filters 250, and the vertical segments of the receiver antenna 220-1 are respectively located between the data lines D1 to D36 and the color filters 250, such that no segments of the receiver antenna 220-1 directly overlap with the data lines, the gate lines and the color filters.

As shown in FIG. 2A, each of the receiver antennas 220-1 to 220-36 is electrically connected to the corresponding data lines D1 to D36 at the outer feeding end of the receiver antenna. In certain embodiments, each of the receiver antennas can be electrically connected to the corresponding data line at either one of the outer feeding end and the inner feeding end thereof. In this case, the other of the outer feeding end and the inner feeding end of the receiver antenna which is not being electrically connected to the corresponding data line may be grounded.

Further, as shown in FIG. 2A, the receiver antennas 220-1 to 220-36 are electrically connected to the corresponding data lines D1 to D36. In certain embodiments, the receiver antennas can be electrically connected to corresponding signal lines, where the signal lines can be data lines, gate lines or other signal lines of the display panel.

Figure 2C:
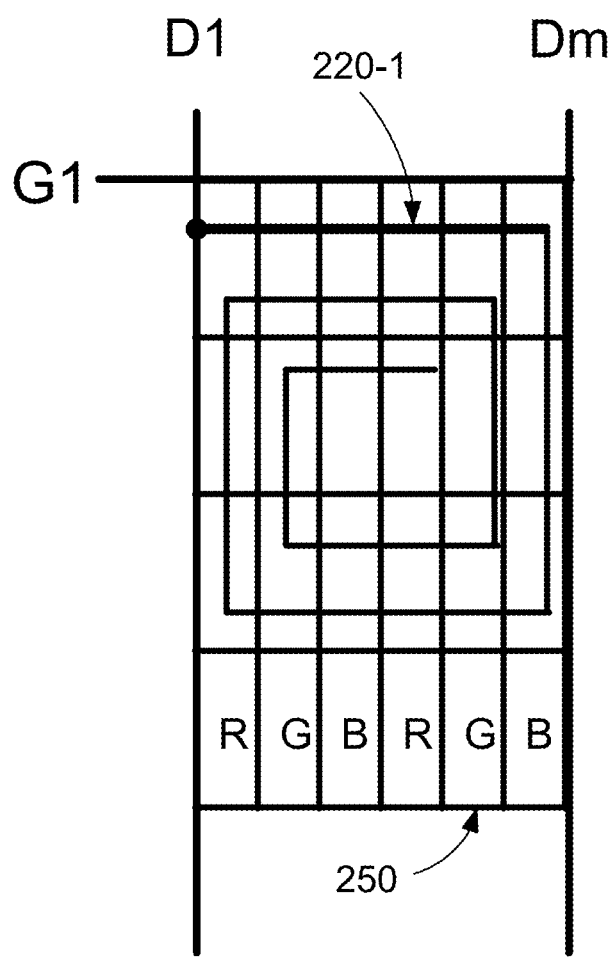
FIG. 2C schematically shows the location of one of the receiver antennas as shown in FIG. 2A according to certain embodiments of the present disclosure.

Moreover, as shown in FIG. 2B, no segments of the receiver antenna directly overlap with the color filters. However, in certain embodiments, the segments of the receiver antenna may overlap with the color filters. For example, FIG. 2C schematically shows the location of one of the receiver antennas as shown in FIG. 2A according to certain embodiments of the present disclosure. As shown in FIG. 2C, the horizontal segments of the receiver antenna 220-1 are respectively located to overlap with the color filters 250, and the vertical segments of the receiver antenna 220-1 are respectively located to overlap with the color filters 250.

Figure 2D:
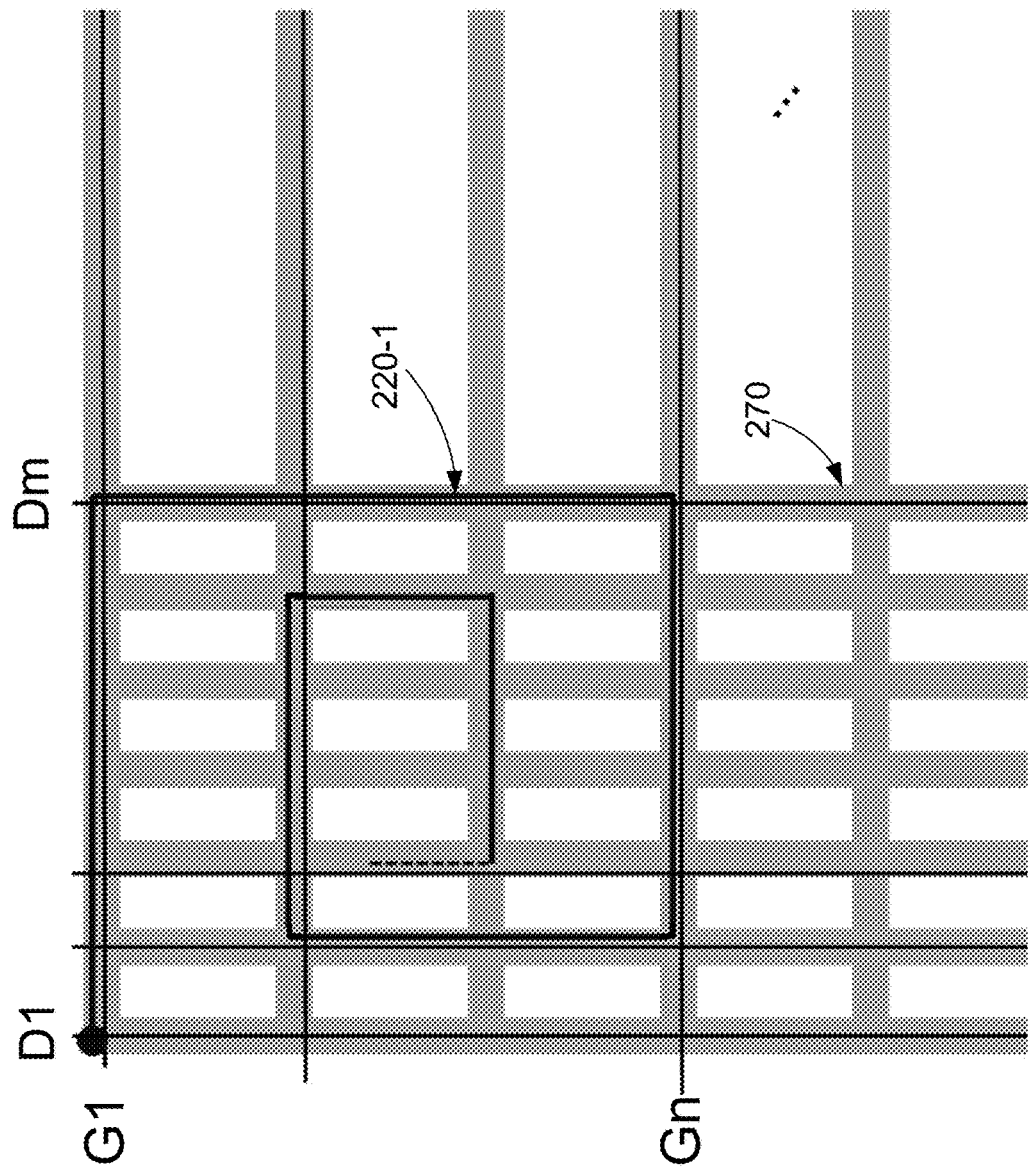
FIG. 2D schematically shows the location of one of the receiver antennas as shown in FIG. 2A according to certain embodiments of the present disclosure.

In certain embodiments, the segments of the receiver antenna may overlap with a black matrix area of the pixel structure along a vertical direction perpendicular to the pixel structure. For example, FIG. 2D schematically shows the location of one of the receiver antennas as shown in FIG. 2A according to certain embodiments of the present disclosure. As shown in FIG. 2D, the segments of the receiver antenna 220-1 are respectively located to overlap with the black matrix areas 270 of the pixel structure. In general, the pixel structure includes gate lines G1 to Gn and data lines D1 to Dm, and the gate lines G1 to Gn and the data lines D1 to Dm are located under normal projection areas of the black matrix areas 270. Further, the receiver antennas also located under the normal projection areas of the black matrix areas 270.

Figure 3:
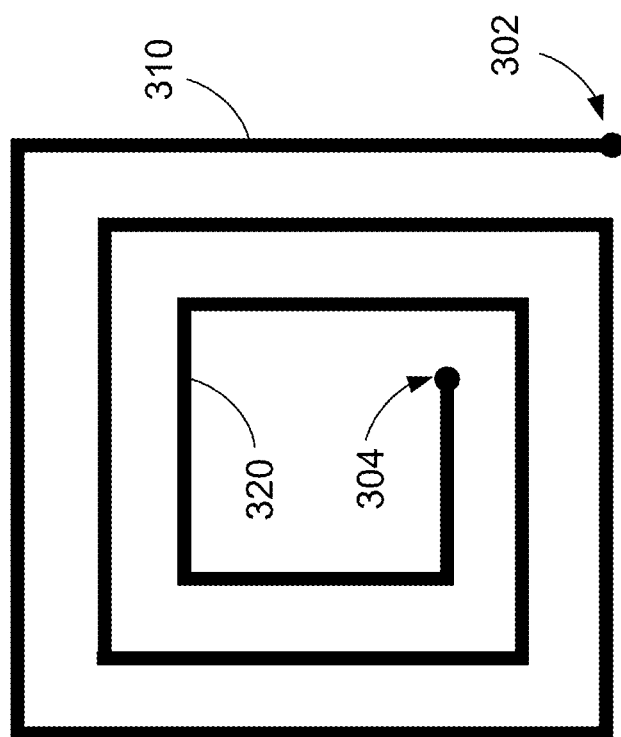
FIG. 3 schematically shows a top view of an antenna according to certain embodiments of the present disclosure.

FIG. 3 schematically shows an antenna according to certain embodiments of the disclosure. Specifically, the antenna 300 as shown in FIG. 3 can be used as a receiver antenna Rx in the receiver antenna structure 150 as shown in FIG. 1A. As shown in FIG. 3, the antenna 300 is winding from an outer feeding end 302 inward to an inner feeding end 304 in a counter-clockwise direction. In certain embodiments, the winding direction of the antenna 200 can be either clockwise or counter-clockwise. Further, and the antenna 300 includes a plurality of vertical segments 310 and horizontal segments 320, forming a plurality of turns of wires. As shown in FIG. 3, the winding number of the antenna 300 has a winding number N=3, indicating that the antenna 300 has three turns of wires. In certain embodiments, the winding number N of the antenna 300 may be determined based on the desired transmission characteristics of the antenna 300.

In certain embodiments, the transmission characteristics of an antenna may be described in the form of an induced decibel (dB), which reflects the transmission performance of the antenna. In the wireless transmission field, the value of the induced dB of an antenna indicates a ratio Rx/Tx, which refers to the ratio of the receiver antenna Rx to the transmitter antenna Tx of the antenna. For example, if a power ratio of the Rx/Tx is X, the amplitude ratio of the Rx/Tx is $(X)^{1/2}$, and the induced dB of the antenna is $10*\log_{10} X$. Generally, an antenna having an induced dB that is greater than −10 dB indicates an acceptable performance for the wireless transmission of the antenna, and an antenna having an induced dB that is close to 0 dB indicates an excellent performance (i.e., minimum transmission loss) for the wireless transmission of the antenna.

As stated above, in a display panel, each of the transmitter antennas Tx has an identical resonance frequency to the resonance frequency of the corresponding receiver antenna Rx, thus forming multiple wireless data transmission pairs Tx-Rx having different resonance frequencies. However, the wireless data transmission between the wireless data transmission pairs Tx-Rx may interfere with one another, which negatively affects the transmission performances for some of the wireless data transmission pairs Tx-Rx. In view of this deficiency, certain aspects of the present disclosure propose a feature that changes the structural arrangements of the receiver antennas Rx in order to reduce the signal interference between the wireless data transmission pairs Tx-Rx.

Figure 4B:
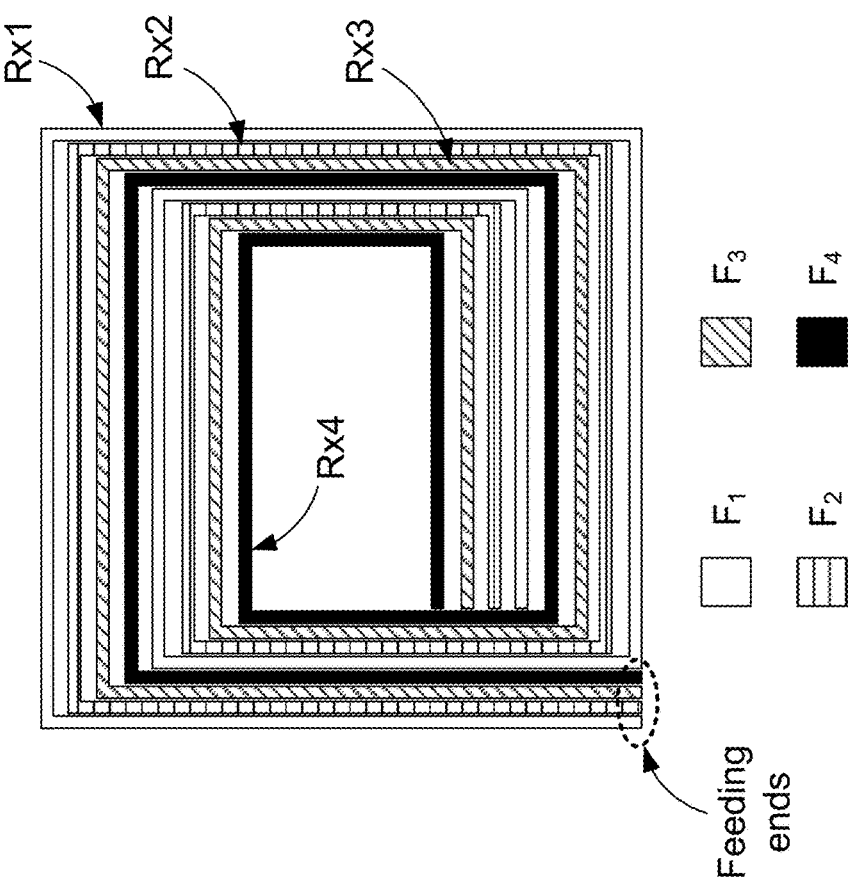
FIG. 4B schematically shows a receiver antenna loop group having four receiver antennas and corresponding to the transmitter antenna loop group as shown in FIG. 4A according to certain embodiments of the present disclosure.
Figure 4A:
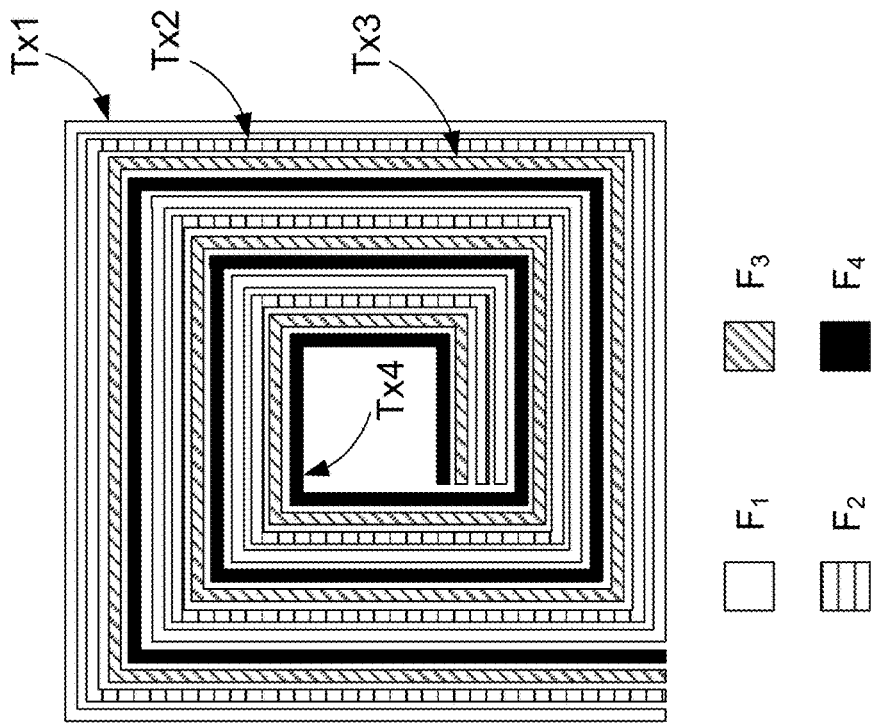
FIG. 4A schematically shows a transmitter antenna loop group having four transmitter antennas according to certain embodiments of the present disclosure.

FIG. 4A schematically shows a transmitter antenna loop group having four transmitter antennas according to certain embodiments of the present disclosure, and FIG. 4B schematically shows a receiver antenna loop group having four receiver antennas and corresponding to the transmitter antenna loop group as shown in FIG. 4A according to certain embodiments of the present disclosure. As shown in FIG. 4A, the transmitter antenna loop group 410 has four transmitter antennas Tx1, Tx2, Tx3 and Tx4 arranged in a substantially concentric manner, where the transmitter antenna Tx1 is the outermost transmitter antenna and the transmitter antenna Tx4 is the innermost transmitter antenna. Correspondingly, as shown in FIG. 4B, the receiver antenna loop group 420 also has four receiver antennas Rx1, Rx2, Rx3 and Rx4 arranged in a substantially concentric manner, where the receiver antenna Rx1 is the outermost receiver antenna and the receiver antenna Rx4 is the innermost receiver antenna. In a sequence from the outermost transmitter antenna Tx1 toward the innermost transmitter antenna Tx4, the transmitter antenna Tx1 has a resonance frequency $F_1$, the transmitter antenna Tx2 has a resonance frequency $F_2$, the transmitter antenna Tx3 has a resonance frequency $F_3$, and the transmitter antenna Tx4 has a resonance frequency $F_4$. Correspondingly, in a sequence from the outermost receiver antenna Rx1 toward the innermost receiver antenna Rx4, the receiver antenna Rx1 has the resonance frequency $F_1$, the receiver antenna Rx2 has the resonance frequency $F_2$, the receiver antenna Rx3 has the resonance frequency $F_3$, and the receiver antenna Rx4 has the resonance frequency $F_4$. In other words, the four transmitter antennas Tx1, Tx2, Tx3 and Tx4 of the transmitter antenna loop group 410 one-to-one correspond to the four receiver antennas Rx1, Rx2, Rx3 and Rx4 of the receiver antenna loop group 420, forming four wireless data transmission pairs Tx1-Rx1, Tx2-Rx2, Tx3-Rx3 and Tx4-Rx4.

As shown in FIG. 4B, the outer feeding ends of the four receiver antennas Rx1, Rx2, Rx3 and Rx4 of the receiver antenna loop group 420 are all located at the same outer bottom-left corner of the receiver antenna loop group 420. Further, the winding number of each of the four receiver antennas Rx1, Rx2, Rx3 and Rx4 of the receiver antenna loop group 420 is 2. Thus, the inner feeding ends of the four receiver antennas Rx1, Rx2, Rx3 and Rx4 of the receiver antenna loop group 420 are all located at the same inner bottom-left corner of the receiver antenna loop group 420. In this case, the outer feeding ends of the four receiver antennas Rx1, Rx2, Rx3 and Rx4 of the receiver antenna loop group 420 are adjacent to one another, and the inner feeding ends of the four receiver antennas Rx1, Rx2, Rx3 and Rx4 of the receiver antenna loop group 420 are also adjacent to one another. As shown in FIG. 3B, the outer feeding ends of the four receiver antennas Rx1, Rx2, Rx3 and Rx4 of the receiver antenna loop group 420 are the feeding ends of the four receiver antennas Rx1, Rx2, Rx3 and Rx4. In this case, the feeding ends of the four receiver antennas Rx1, Rx2, Rx3 and Rx4 as shown in FIG. 3B are adjacent to one another. Further, for the four receiver antennas Rx1, Rx2, Rx3 and Rx4 of the receiver antenna loop group 420 as shown in FIG. 4B, $F_4 > F_3 > F_2 > F_1$. In other words, in a sequence from the outermost receiver antenna Rx1 toward the innermost receiver antenna Rx4, the resonance frequencies of the four receiver antennas Rx1, Rx2, Rx3 and Rx4 are gradually increasing. For example, in one embodiment, $F_1 = 3$ MHz, $F_2 = 5$ MHz, $F_3 = 7$ MHz, and $F_4 = 9$ MHz. In other embodiments, different resonance frequencies may be applied to the four receiver antennas Rx1, Rx2, Rx3 and Rx4.

As stated above, the four transmitter antennas Tx1, Tx2, Tx3 and Tx4 of the transmitter antenna loop group 410 one-to-one correspond to the four receiver antennas Rx1, Rx2, Rx3 and Rx4 of the receiver antenna loop group 420. However, signal interference may occur between the transmitter antenna loop group 410 and the receiver antenna loop group 420. For example, while the transmitter antenna Tx1 forms a wireless data transmission pair with the corresponding receiver antenna Rx1, the transmitter antenna Tx1 may also generate interference signals to other three receiver antennas Rx2, Rx3 and Rx4. Similarly, the transmitter antenna Tx2 may generate interference signals to the three receiver antennas Rx1, Rx3 and Rx4; the transmitter antenna Tx3 may generate interference signals to other three receiver antennas Rx1, Rx2 and Rx4; and the transmitter antenna Tx4 may generate interference signals to other three receiver antennas Rx1, Rx2 and Rx3.

To describe the signals being transmitted between the transmitter antenna loop group 410 and the receiver antenna loop group 420, the signal transmitted from the transmitter antenna Txm to the receiver antenna Rxn is labeled as S(m,n), where each of m and n is an integer selected from 1-4. For example, S(1,1) indicates the signal transmitted from the transmitter antenna Tx1 to the receiver antenna Rx1, and S(1, 2) indicates the interference signal transmitted from the transmitter antenna Tx1 to the receiver antenna Rx2. Other labels of the signals are not herein elaborated.

Figure 4C:
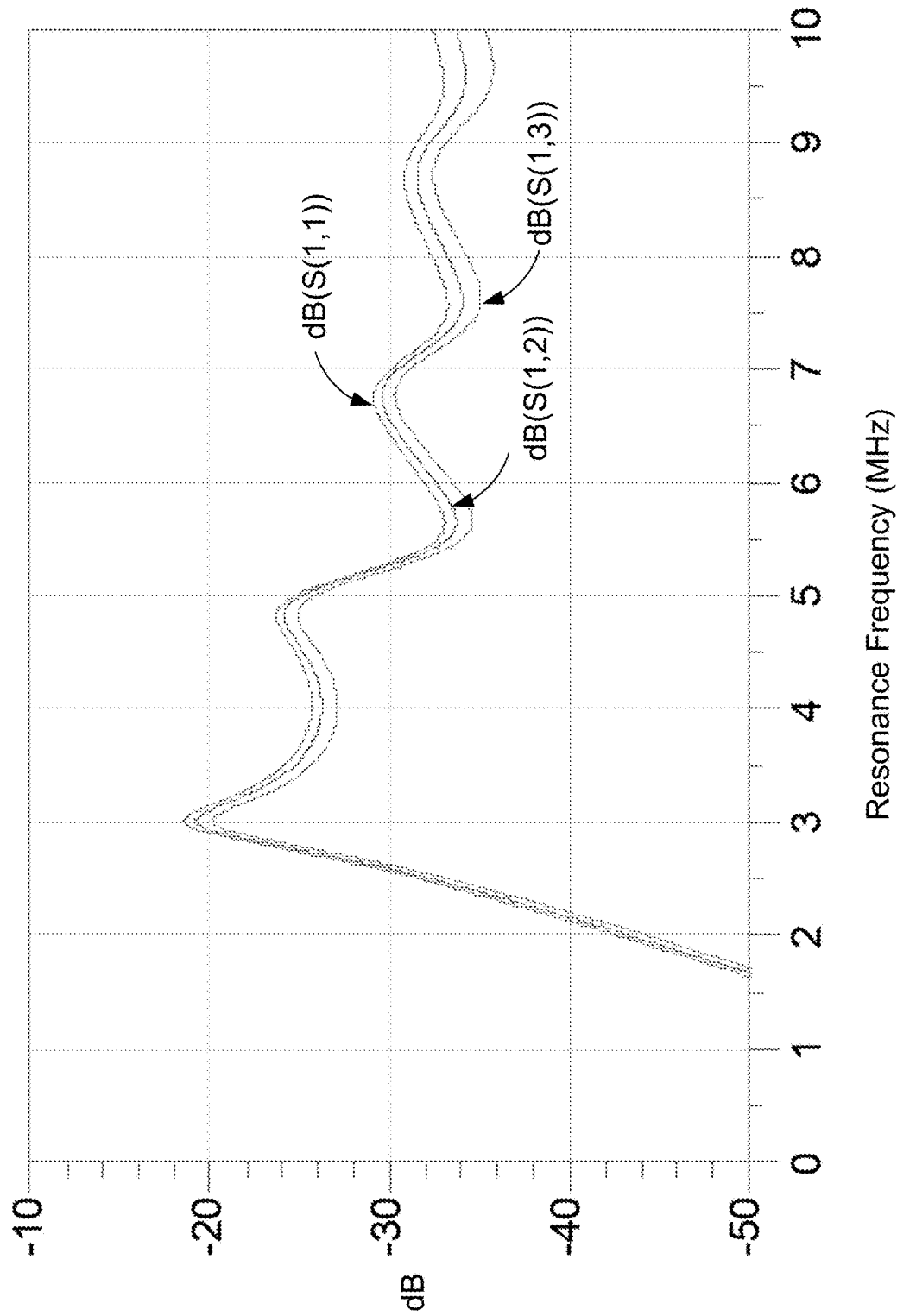
FIG. 4C shows a chart illustrating a relationship between a resonance frequency of the transmitter antenna Tx1 as shown in FIG. 4A to an induced dB of the interference signals of the receiver antennas as shown in FIG. 4B.

FIG. 4C shows a chart illustrating a relationship between a resonance frequency of the transmitter antenna Tx1 as shown in FIG. 4A to an induced dB of the interference signals of the receiver antennas as shown in FIG. 4B. As shown in FIG. 4C, three curves are obtained based on simulation to show the dB value of the signal S(1,1) and two interference signals S(1,2) and S(1,3). Since the resonance frequency of the transmitter antenna Tx1 is $F_1$=3 MHz, the peak of each of the three curves is located around 3 MHz. Specifically, for the curve of the interference signal S(1,2), dB(S(1,2))=−19.220 at the peak frequency of 3.016 MHz, and for the curve of the interference signal S(1,3), dB(S(1,3))=−20.219 at the peak frequency of 3.033 MHz. In other words, the interferences for the two receiver antennas Rx2 and Rx3 caused by the transmitter antenna Tx1 are significant.

Figure 4D:
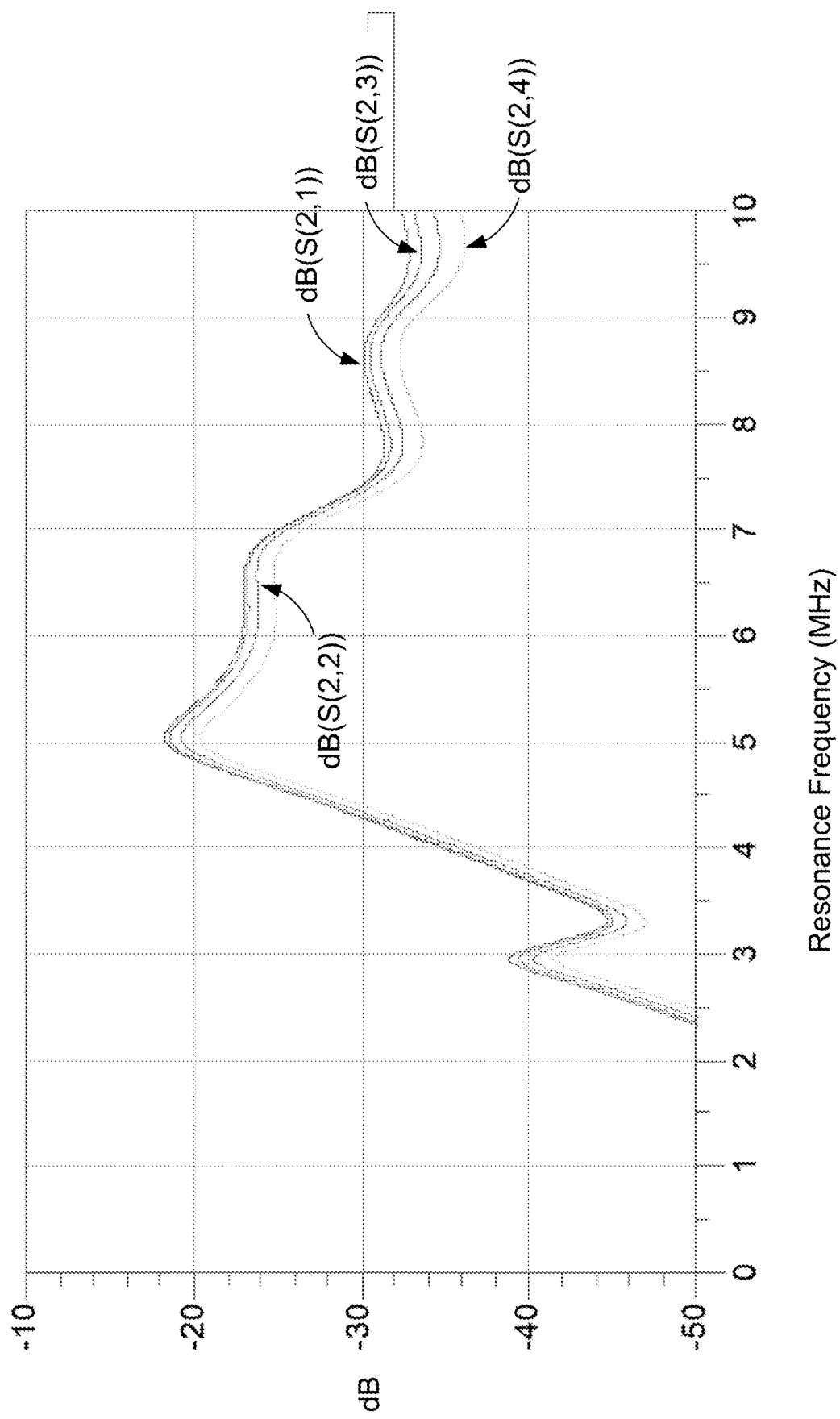
FIG. 4D shows a chart illustrating a relationship between a resonance frequency of the transmitter antenna Tx2 as shown in FIG. 4A to an induced dB of the interference signals of the receiver antennas as shown in FIG. 4B.

FIG. 4D shows a chart illustrating a relationship between a resonance frequency of the transmitter antenna Tx2 as shown in FIG. 4A to an induced dB of the interference signals of the receiver antennas as shown in FIG. 4B. As shown in FIG. 4D, four curves are obtained based on simulation to show the dB value of the signal S(2,2) and two interference signals S(2,1), S(2,3) and S(2,4). Since the resonance frequency of the transmitter antenna Tx2 is $F_2$=5 MHz, the peak of each of the four curves is located around 5 MHz. Specifically, for the curve of the interference signal S(2,1), dB(S(2,1))=−18.335 at the peak frequency of 5.081 MHz; for the curve of the interference signal S(2,3), dB(S(2,3))=−19.296 at the peak frequency of 5.082 MHz; and for the curve of the interference signal S(2,4), dB(S(2,4))=−20.411 at the peak frequency of 5.073 MHz. In other words, the interferences for the three receiver antennas Rx1, Rx3 and Rx4 caused by the transmitter antenna Tx2 are significant.

Figure 4E:
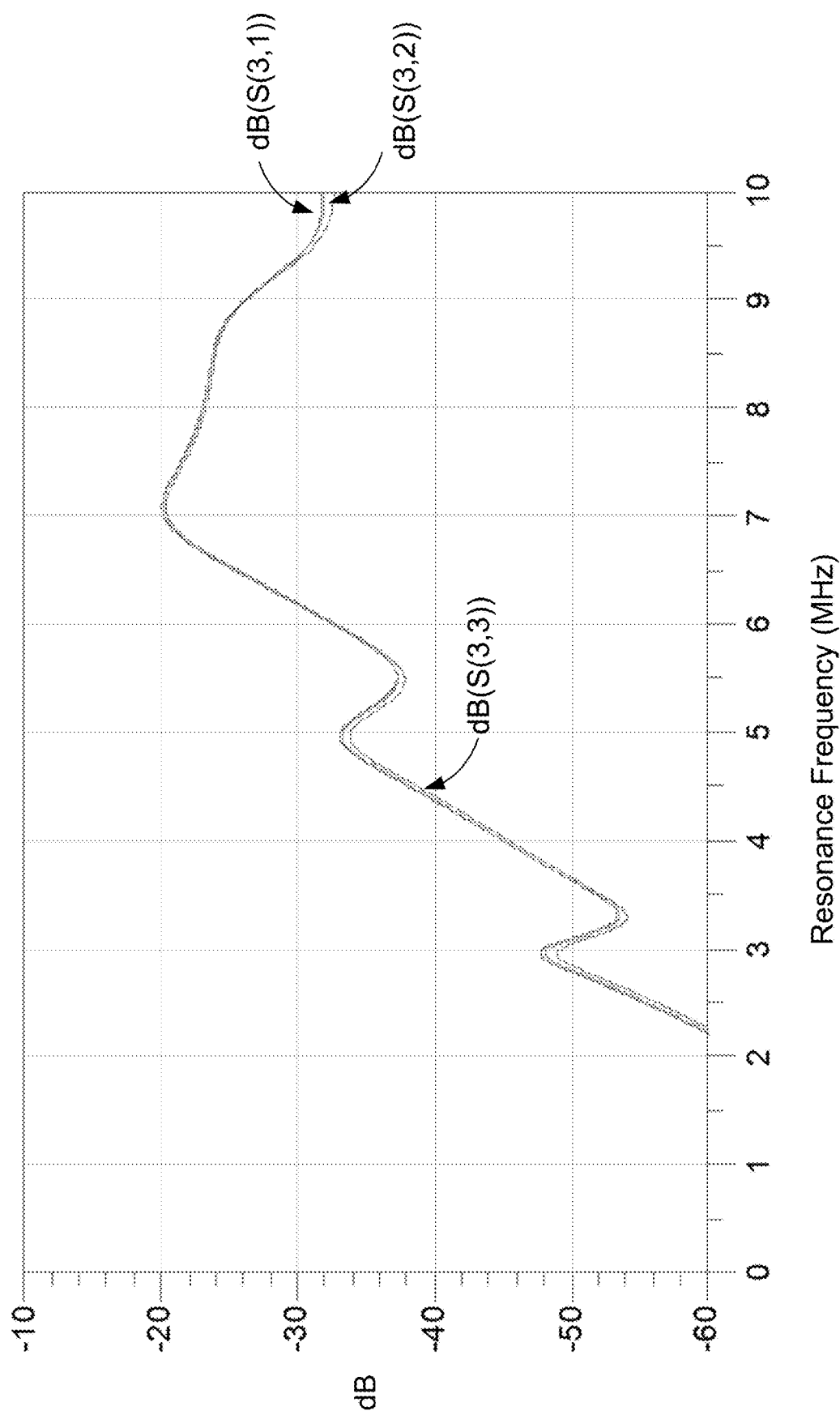
FIG. 4E shows a chart illustrating a relationship between a resonance frequency of the transmitter antenna Tx3 as shown in FIG. 4A to an induced dB of the interference signals of the receiver antennas as shown in FIG. 4B.

FIG. 4E shows a chart illustrating a relationship between a resonance frequency of the transmitter antenna Tx3 as shown in FIG. 4A to an induced dB of the interference signals of the receiver antennas as shown in FIG. 4B. As shown in FIG. 4E, three curves are obtained based on simulation to show the dB value of the signal S(3,3) and two interference signals S(3,1) and S(3,2). Since the resonance frequency of the transmitter antenna Tx3 is $F_3$=7 MHz, the peak of each of the three curves is located around 7 MHz. Specifically, for the curve of the interference signal S(3,1), dB(S(3,1))=−20.127 at the peak frequency of 7.126 MHz, and for the curve of the interference signal S(3,2), dB(S(3,2))=−20.062 at the peak frequency of 7.122 MHz. In other words, the interferences for the two receiver antennas Rx1 and Rx2 caused by the transmitter antenna Tx3 are significant.

As shown in FIGS. 4C, 4D and 4E, for the transmitter antenna loop group 410 as shown in FIG. 4A and the receiver antenna loop group 420 as shown in FIG. 4B, a total of seven interference signals may be significant. Therefore, the structural arrangements of the receiver antennas Rx may be changed in order to reduce the signal interference between the wireless data transmission pairs Tx-Rx.

Figure 5A:
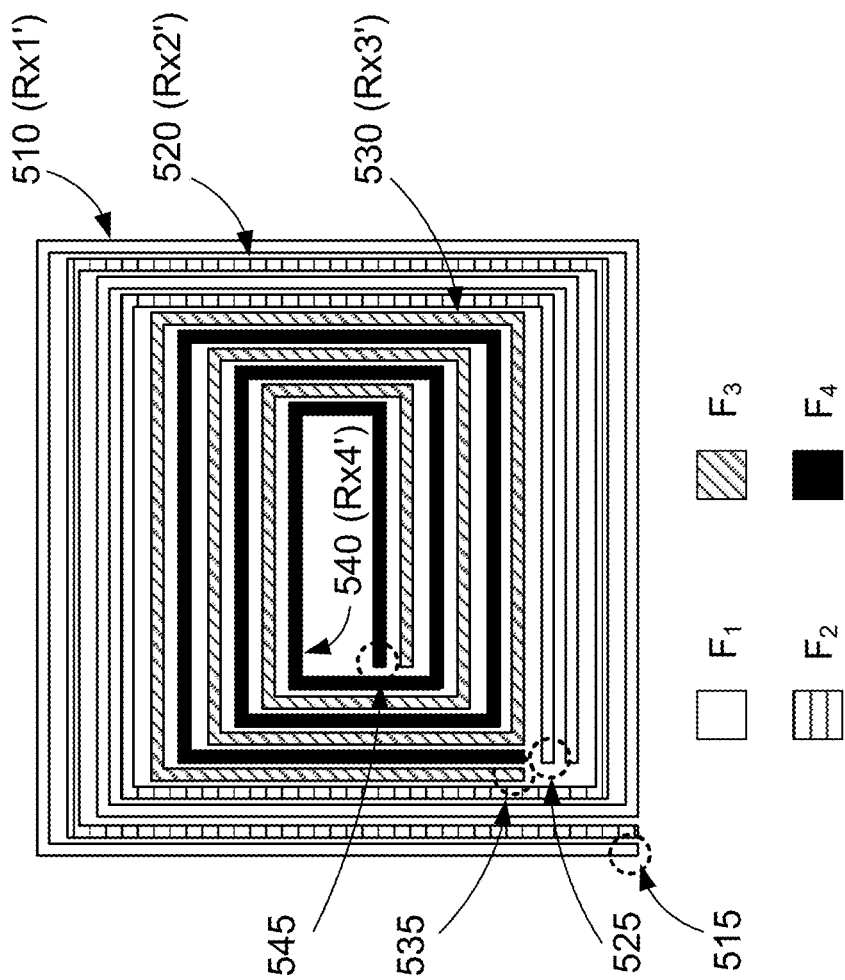
FIG. 5A schematically shows a receiver antenna loop group having four receiver antennas and corresponding to the transmitter antenna loop group as shown in FIG. 4A according to certain embodiments of the present disclosure.

FIG. 5A schematically shows a receiver antenna loop group having four receiver antennas and corresponding to the transmitter antenna loop group as shown in FIG. 4A according to certain embodiments of the present disclosure. As shown in FIG. 5A, the receiver antenna loop group 500 includes four receiver antennas 510, 520, 530 and 540 arranged in a substantially concentric manner. However, the structural arrangement of the four receiver antennas 510, 520, 530 and 540 are different from the four receiver antennas Rx1, Rx2, Rx3 and Rx4 as shown in FIG. 4B. Specifically, as shown in FIG. 5A, the two receiver antennas 510 and 520 are the two outer receiver antennas, and the two receiver antennas 530 and 540 are the two inner receiver antennas. In other words, the inner diameter of each of the receiver antennas 510 and 520 is greater than the outer diameter of each of the receiver antennas 530 and 540.

One major structural feature of the receiver antenna loop group 500 as shown in FIG. 5A which is different from the receiver antenna loop group 420 as shown in FIG. 4B exists in that the feeding ends of the four receiver antennas 510, 520, 530 and 540 of the receiver antenna loop group 500 as shown in FIG. 5A are not adjacent to one another. Specifically, the feeding end 515 of the receiver antenna 510 is the outer feeding end of the receiver antenna 510; the feeding end 525 of the receiver antenna 520 is the inner feeding end of the receiver antenna 520; the feeding end 535 of the receiver antenna 530 is the outer feeding end of the receiver antenna 530; and the feeding end 545 of the receiver antenna 540 is the inner feeding end of the receiver antenna 540. All of the feeding ends 515, 525, 535 and 545 are located at the bottom-left corner of the receiver antenna loop group 500. However, for the two feeding ends 515 and 535 that are outer feeding ends, there are segments of the receiver antennas located between the feeding end 515 of the receiver antenna 510 and the feeding end 535 of the receiver antenna 530; and for the two feeding ends 525 and 545 that are inner feeding ends, there are segments of the receiver antennas located between the feeding end 525 of the receiver antenna 520 and the feeding end 545 of the receiver antenna 540. Therefore, the feeding ends 515, 525, 535 and 545 of the four receiver antennas 510, 520, 530 and 540 of the receiver antenna loop group 500 as shown in FIG. 5A are not adjacent to one another.

Further, the resonance frequencies of the receiver antennas 510, 520, 530 and 540 of the receiver antenna loop group 500 as shown in FIG. 5A are also different from the resonance frequencies of the receiver antennas Rx1, Rx2, Rx3 and Rx4 of the receiver antenna loop group 420 as shown in FIG. 4B. Specifically, in a sequence from the outermost receiver antenna 510 toward the innermost receiver antenna 540, the receiver antenna 510 has the resonance frequency $F_1$=3 MHz, the receiver antenna 520 has the resonance frequency $F_2$=7 MHz, the receiver antenna 530 has the resonance frequency $F_3$=9 MHz, and the receiver antenna 540 has the resonance frequency $F_4$=5 MHz. Thus, for the four receiver antennas 510, 520, 530 and 540 of the receiver antenna loop group 500 as shown in FIG. 5A, $F_3>F_2>F_4>F_1$. In other words, in a sequence from the outermost receiver antenna 510 toward the innermost receiver antenna 540, the resonance frequencies are neither gradually increasing nor gradually decreasing. Moreover, the four transmitter antennas Tx1, Tx2, Tx3 and Tx4 of the transmitter antenna loop group 410 one-to-one correspond to the four receiver antennas 510, 520, 530 and 540 of the receiver antenna loop group 500, so the resonance frequencies of the four transmitter antennas Tx1, Tx2, Tx3 and Tx4 of the transmitter antenna loop group 410 also has to be adjusted. Specifically, the receiver antenna 510 functions as a corresponding receiver antenna Rx1' to the transmitter antenna Tx1, so the resonance frequency of the transmitter antenna Tx1 remains $F_1$=3 MHz; the receiver antenna 520 functions as a corresponding receiver antenna Rx2' to the transmitter antenna Tx2, so the resonance frequency of the transmitter antenna Tx2 is correspondingly adjusted to $F_2$=7 MHz; the receiver antenna 530 functions as a corresponding receiver antenna Rx3' to the transmitter antenna Tx3, so the resonance frequency of the transmitter antenna Tx3 is correspondingly adjusted to $F_3$=9 MHz; and the receiver antenna 540 functions as a corresponding receiver antenna Rx4' to the transmitter antenna Tx4, so the resonance frequency of the transmitter antenna Tx4 is correspondingly adjusted to $F_4=5$ MHz.

Comparing the receiver antenna loop group 500 as shown in FIG. 5A to the receiver antenna loop group 420 as shown in FIG. 4B, signal interference is reduced between the transmitter antenna loop group 410 and the receiver antenna loop group 500. To describe the signals being transmitted between the transmitter antenna loop group 410 and the receiver antenna loop group 500, the signal transmitted from the transmitter antenna Txm to the receiver antenna Rxn' is labeled as S(m,n)', where each of m and n is an integer selected from 1-4. For example, S(1,3)' indicates the interference signal transmitted from the transmitter antenna Tx1 to the receiver antenna 530 (Rx3'). Other labels of the signals are not herein elaborated.

Figure 5B:
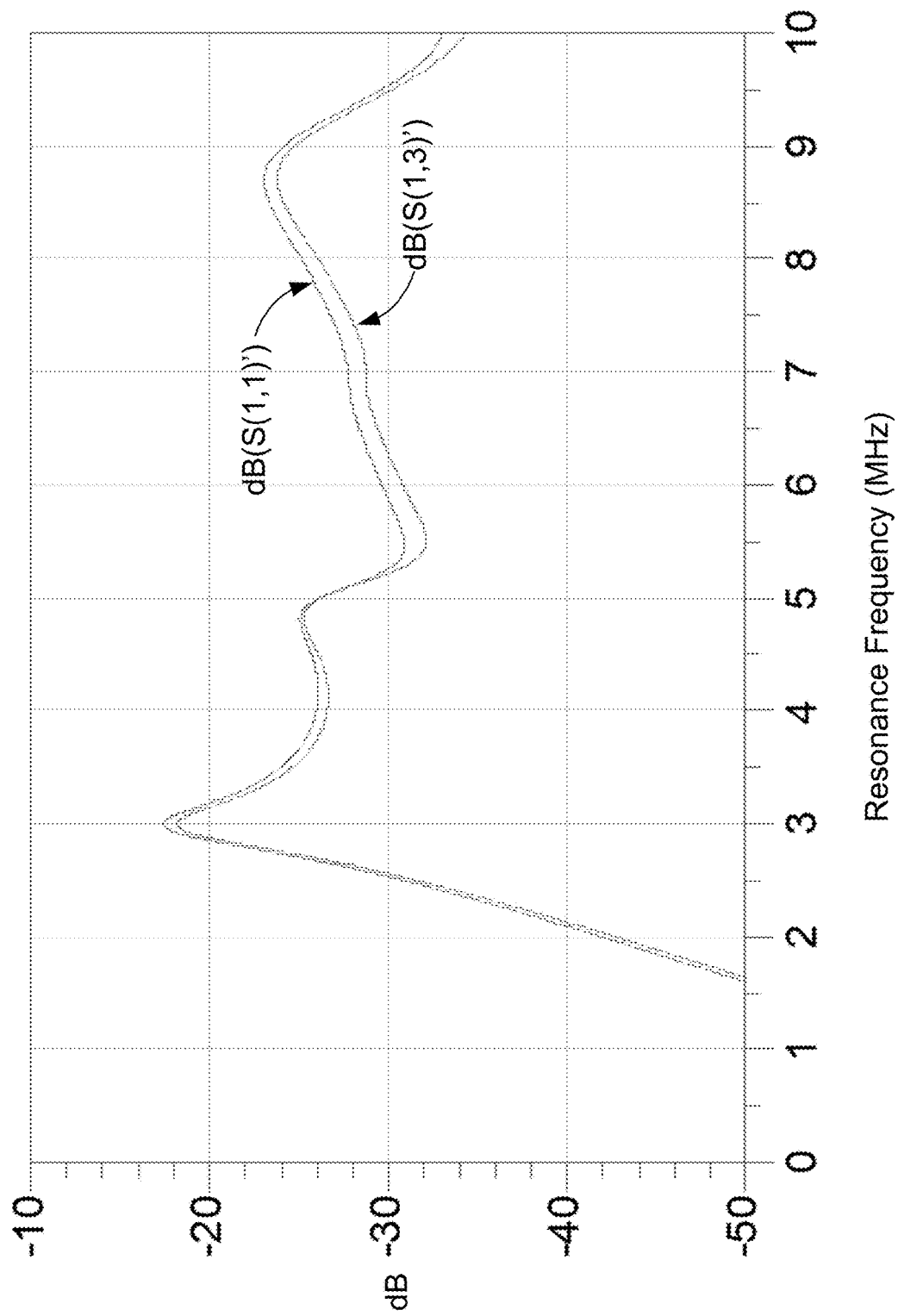
FIG. 5B shows a chart illustrating a relationship between a resonance frequency of the transmitter antenna Tx1 as shown in FIG. 4A to an induced dB of the interference signals of the receiver antennas as shown in FIG. 5A.

FIG. 5B shows a chart illustrating a relationship between a resonance frequency of the transmitter antenna Tx1 as shown in FIG. 4A to an induced dB of the interference signals of the receiver antennas as shown in FIG. 5A. As shown in FIG. 5B, two curves are obtained based on simulation to show the dB value of the signal S(1,1)' and the interference signal S(1,3)'. Since the resonance frequency of the transmitter antenna Tx1 in this embodiment is $F_1=3$ MHz, the peak of each of the two curves is located around 3 MHz. Specifically, for the curve of the interference signal S(1,3)', dB(S(1,3)')=−18.166 at the peak frequency of 3.003 MHz. In other words, the interference for the receiver antenna 530 (Rx3') caused by the transmitter antenna Tx1 is significant.

Figure 5C:
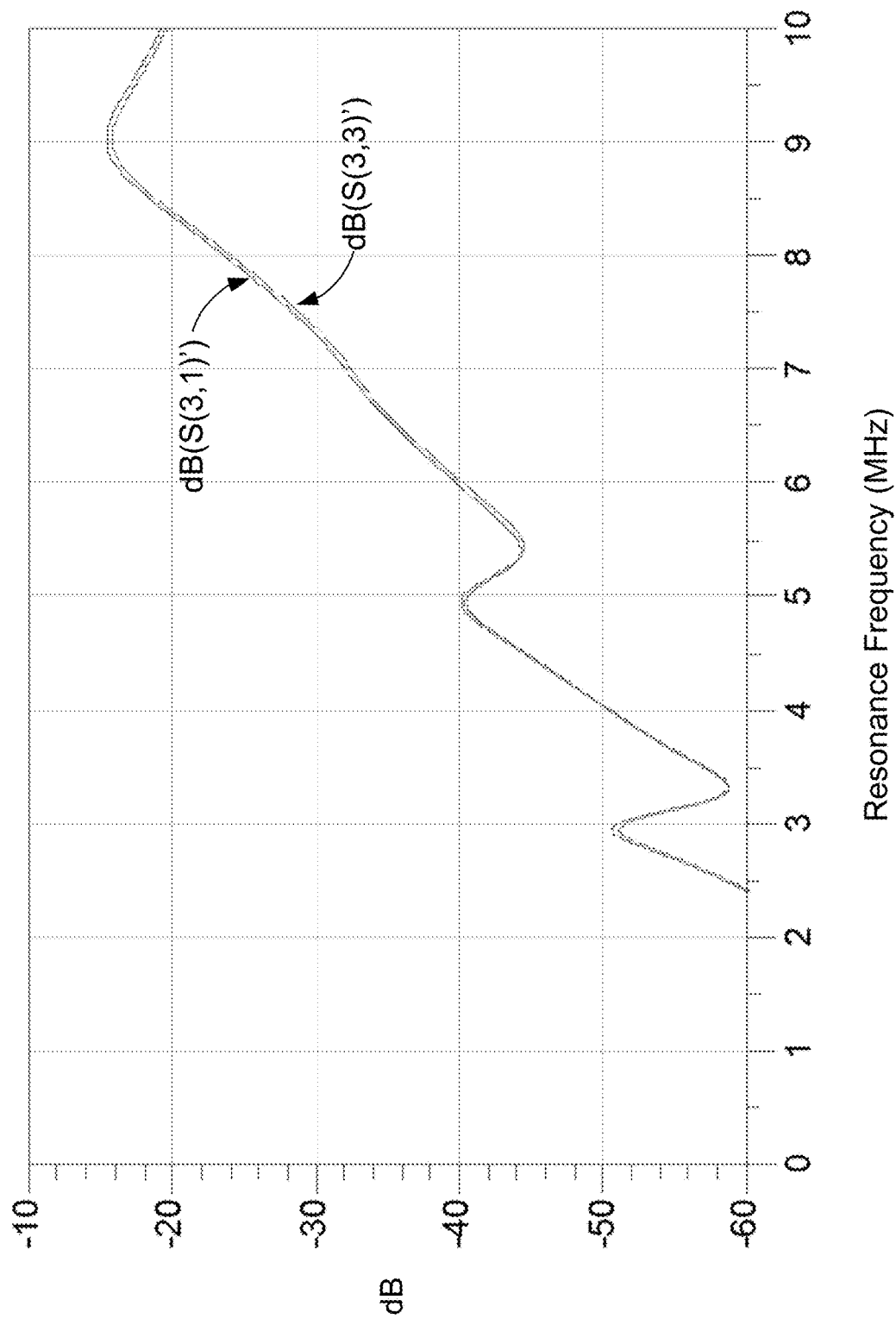
FIG. 5C shows a chart illustrating a relationship between a resonance frequency of the transmitter antenna Tx3 as shown in FIG. 4A to an induced dB of the interference signals of the receiver antennas as shown in FIG. 5A.

FIG. 5C shows a chart illustrating a relationship between a resonance frequency of the transmitter antenna Tx3 as shown in FIG. 4A to an induced dB of the interference signals of the receiver antennas as shown in FIG. 5A. As shown in FIG. 5C, two curves are obtained based on simulation to show the dB value of the signal S(3,3)' and the interference signal S(3,1)'. Since the resonance frequency of the transmitter antenna Tx3 in this embodiment is $F_3=9$ MHz, the peak of each of the two curves is located around 9 MHz. Specifically, for the curve of the interference signal S(3,1)', dB(S(3,1)')=−15.676 at the peak frequency of 8.726 MHz. In other words, the interference for the receiver antenna 510 (Rx1') caused by the transmitter antenna Tx3 is significant.

Figure 5D:
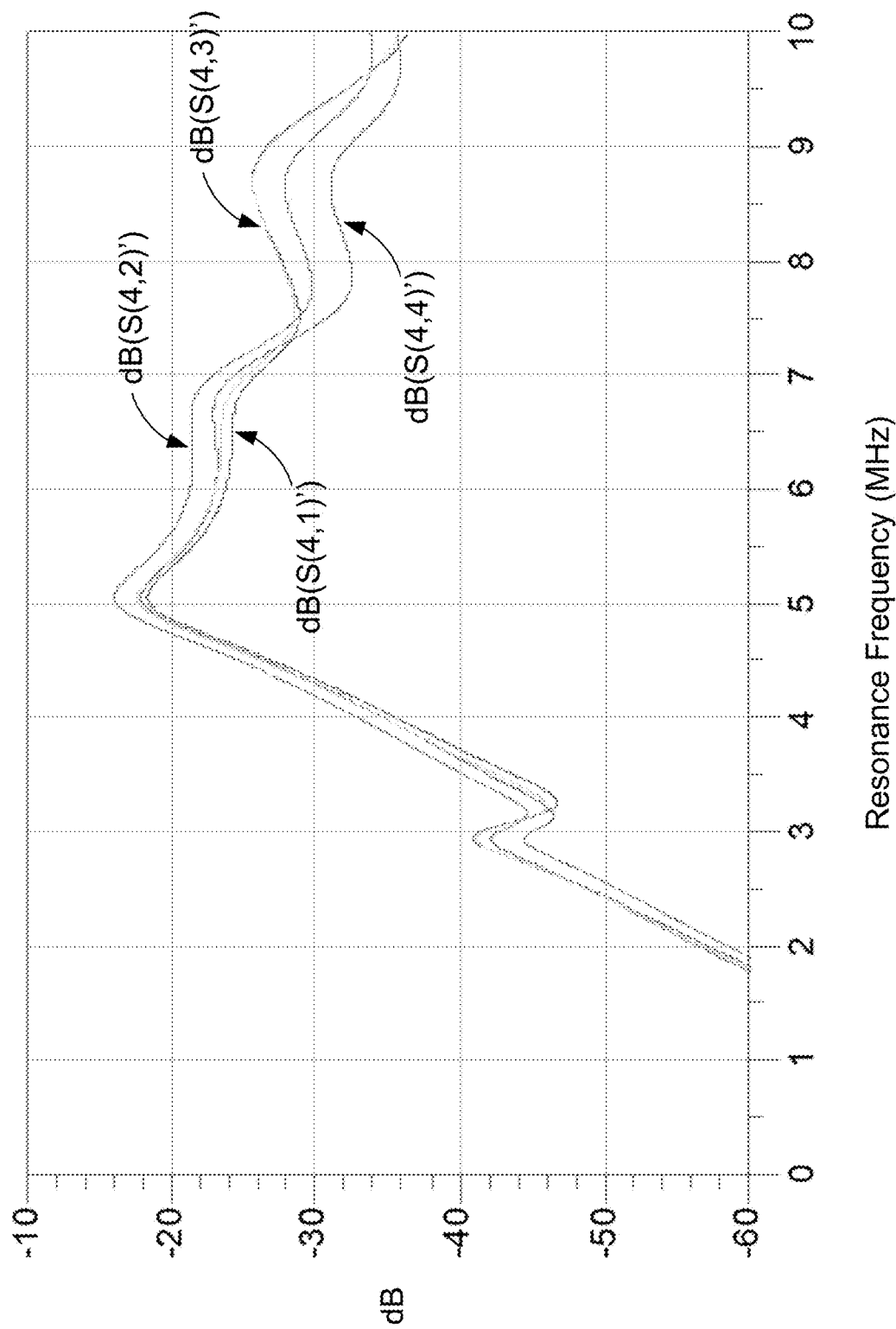
FIG. 5D shows a chart illustrating a relationship between a resonance frequency of the transmitter antenna Tx4 as shown in FIG. 4A to an induced dB of the interference signals of the receiver antennas as shown in FIG. 5A.

FIG. 5D shows a chart illustrating a relationship between a resonance frequency of the transmitter antenna Tx4 as shown in FIG. 4A to an induced dB of the interference signals of the receiver antennas as shown in FIG. 5A. As shown in FIG. 5D, four curves are obtained based on simulation to show the dB value of the signal S(4,4)' and the interference signals S(4,1)', S(4,2)' and S(4,3)'. Since the resonance frequency of the transmitter antenna Tx4 in this embodiment is $F_4=5$ MHz, the peak of each of the two curves is located around 5 MHz. Specifically, for the curve of the interference signal S(4,1)', dB(S(4,1)')=−18.432 at the peak frequency of 5.126 MHz; for the curve of the interference signal S(4,2)', dB(S(4,2)')=−15.999 at the peak frequency of 5.033 MHz; and for the curve of the interference signal S(4,3)', dB(S(4,3)')=−17.471 at the peak frequency of 5.046 MHz. In other words, the interferences for the receiver antennas 510 (Rx1'), 520 (Rx2') and 530 (Rx3') caused by the transmitter antenna Tx4 are significant.

As shown in FIGS. 5B, 5C and 5D, for the transmitter antenna loop group 410 as shown in FIG. 4A and the receiver antenna loop group 500 as shown in FIG. 5A, five interference signals remain significant. In other words, comparing to the receiver antenna loop group 420 as shown in FIG. 4B, signal interference has been reduced using the receiver antenna loop group 500 as shown in FIG. 5A.

Figure 6A:
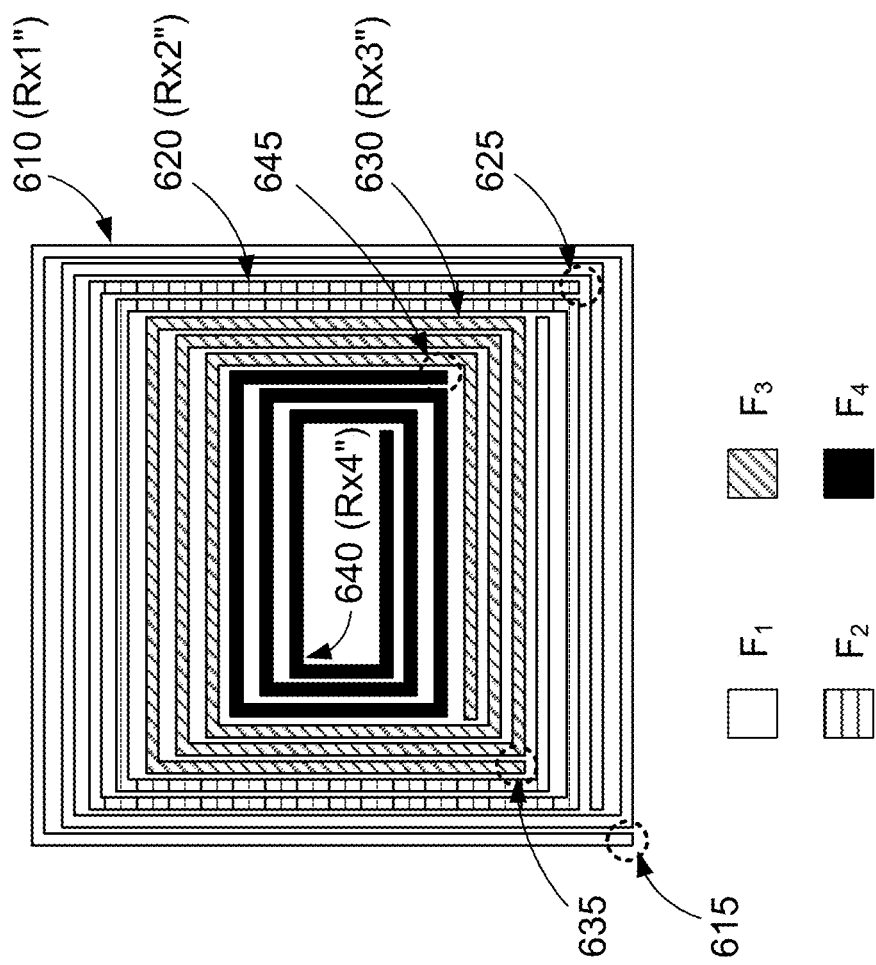
FIG. 6A schematically shows a receiver antenna loop group having four receiver antennas and corresponding to the transmitter antenna loop group as shown in FIG. 4A according to certain embodiments of the present disclosure.

In another embodiment, the structural arrangements of the receiver antennas Rx may be further changed in order to reduce the signal interference between the wireless data transmission pairs Tx-Rx. FIG. 6A schematically shows a receiver antenna loop group having four receiver antennas and corresponding to the transmitter antenna loop group as shown in FIG. 4A according to certain embodiments of the present disclosure. As shown in FIG. 6A, the receiver antenna loop group 600 includes four receiver antennas 610, 620, 630 and 640 arranged in a substantially concentric manner. However, the structural arrangement of the four receiver antennas 610, 620, 630 and 640 are different from the four receiver antennas Rx1, Rx2, Rx3 and Rx4 as shown in FIG. 4B or the four receiver antennas 510, 520, 530 and 540 as shown in FIG. 5A. Specifically, as shown in FIG. 6A, the four receiver antennas 610, 620, 630 and 620 are sequentially arranged in different winding directions, where the outermost receiver antenna 610 winds from its outer feeding end inward to its inner feeding end in a clockwise direction; the receiver antenna 620 is located inside the outermost receiver antenna 610, and winds from its outer feeding end inward to its inner feeding end in a counter-clockwise direction; the receiver antenna 630 is located inside the receiver antenna 620, and winds from its outer feeding end inward to its inner feeding end in a clockwise direction; and the innermost receiver antenna 640 is located inside the receiver antenna 630, and winds from its outer feeding end inward to its inner feeding end in a counter-clockwise direction. The inner diameter of the receiver antenna 610 is greater than the outer diameter of each of the receiver antennas 620, 630 and 640. The inner diameter of the receiver antenna 620 is greater than the outer diameter of each of the receiver antennas 630 and 640. The inner diameter of the receiver antenna 630 is greater than the outer diameter of the receiver antenna 640.

Moreover, the feeding ends of the four receiver antennas 610, 620, 630 and 640 of the receiver antenna loop group 600 as shown in FIG. 6A are not adjacent to one another. Specifically, all of the feeding ends 615, 625, 635 and 645 of the receiver antennas 610, 620, 630 and 640 are the outer feeding ends. However, the feeding end 615 of the receiver antenna 610 and the feeding end 635 of the receiver antenna 630 are located at the bottom-left corner of the receiver antenna loop group 600, and the feeding end 625 of the receiver antenna 620 and the feeding end 645 of the receiver antenna 640 are located at the bottom-right corner of the receiver antenna loop group 600. For the two feeding ends 615 and 635 that are located at the same bottom-left corner, there are segments of the receiver antennas located between the feeding end 615 of the receiver antenna 610 and the feeding end 635 of the receiver antenna 630; and for the two feeding ends 625 and 645 that are that are located at the same bottom-right corner, there are segments of the receiver antennas located between the feeding end 625 of the receiver antenna 620 and the feeding end 645 of the receiver antenna 640. Therefore, the feeding ends 615, 625, 635 and 645 of the four receiver antennas 610, 620, 630 and 640 of the receiver antenna loop group 600 as shown in FIG. 6A are not adjacent to one another.

Further, the resonance frequencies of the receiver antennas 610, 620, 630 and 640 of the receiver antenna loop group 600 as shown in FIG. 6A are also different from the resonance frequencies of the receiver antennas Rx1, Rx2, Rx3 and Rx4 of the receiver antenna loop group 420 as shown in FIG. 4B. Specifically, in a sequence from the outermost receiver antenna 610 toward the innermost receiver antenna 640, the receiver antenna 610 has the resonance frequency $F_1=3$ MHz, the receiver antenna 620 has the resonance frequency $F_2=7$ MHz, the receiver antenna 630 has the resonance frequency $F_3=5$ MHz, and the receiver antenna 640 has the resonance frequency $F_4=9$ MHz. Thus, for the four receiver antennas 610, 620, 630 and 640 of the receiver antenna loop group 600 as shown in FIG. 6A, $F_4>F_2>F_3>F_1$. In other words, in a sequence from the outermost receiver antenna 610 toward the innermost receiver antenna 640, the resonance frequencies are neither gradually increasing nor gradually decreasing. Moreover, the four transmitter antennas Tx1, Tx2, Tx3 and Tx4 of the transmitter antenna loop group 410 one-to-one correspond to the four receiver antennas 610, 620, 630 and 640 of the receiver antenna loop group 600, so the resonance frequencies of the four transmitter antennas Tx1, Tx2, Tx3 and Tx4 of the transmitter antenna loop group 410 also has to be adjusted. Specifically, the receiver antenna 610 functions as a corresponding receiver antenna Rx1" to the transmitter antenna Tx1, so the resonance frequency of the transmitter antenna Tx1 remains $F_1=3$ MHz; the receiver antenna 620 functions as a corresponding receiver antenna Rx2" to the transmitter antenna Tx2, so the resonance frequency of the transmitter antenna Tx2 is correspondingly adjusted to $F_2=7$ MHz; the receiver antenna 630 functions as a corresponding receiver antenna Rx3" to the transmitter antenna Tx3, so the resonance frequency of the transmitter antenna Tx3 is correspondingly adjusted to $F_3=5$ MHz; and the receiver antenna 540 functions as a corresponding receiver antenna Rx4" to the transmitter antenna Tx4, so the resonance frequency of the transmitter antenna Tx4 remains $F_4=9$ MHz.

Comparing the receiver antenna loop group 600 as shown in FIG. 6A to the receiver antenna loop group 420 as shown in FIG. 4B and the receiver antenna loop group 500 as shown in FIG. 5A, signal interference is further reduced between the transmitter antenna loop group 410 and the receiver antenna loop group 600. To describe the signals being transmitted between the transmitter antenna loop group 410 and the receiver antenna loop group 600, the signal transmitted from the transmitter antenna Txm to the receiver antenna Rxn" is labeled as S(m,n)", where each of m and n is an integer selected from 1-4. For example, S(1,2)" indicates the interference signal transmitted from the transmitter antenna Tx1 to the receiver antenna 620 (Rx2"). Other labels of the signals are not herein elaborated.

Figure 6B:
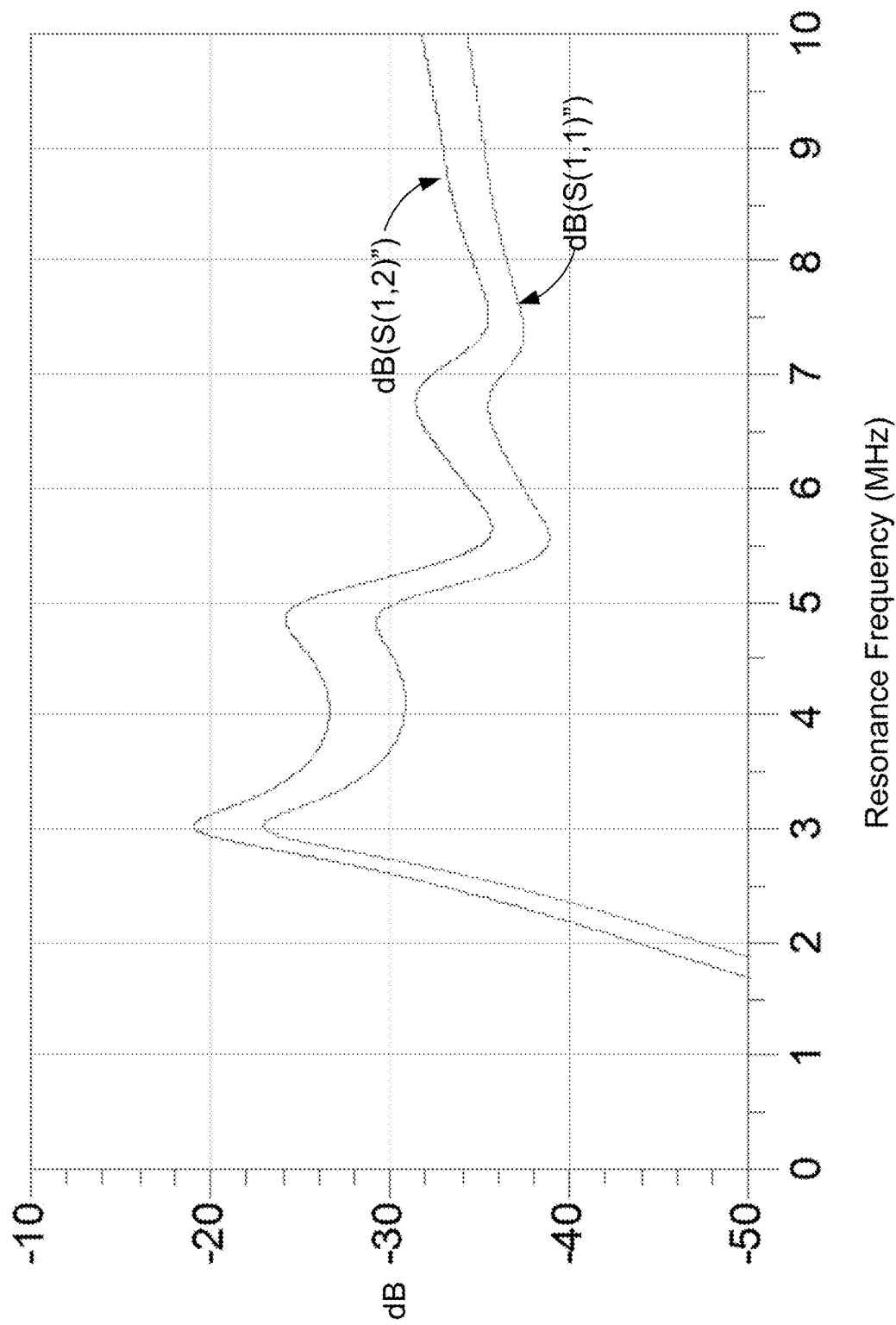
FIG. 6B shows a chart illustrating a relationship between a resonance frequency of the transmitter antenna Tx1 as shown in FIG. 4A to an induced dB of the interference signals of the receiver antennas as shown in FIG. 6A.

FIG. 6B shows a chart illustrating a relationship between a resonance frequency of the transmitter antenna Tx1 as shown in FIG. 4A to an induced dB of the interference signals of the receiver antennas as shown in FIG. 6A. As shown in FIG. 6B, two curves are obtained based on simulation to show the dB value of the signal S(1,1)" and the interference signal S(1,2)". Since the resonance frequency of the transmitter antenna Tx1 in this embodiment is $F_1=3$ MHz, the peak of each of the two curves is located around 3 MHz. Specifically, for the curve of the interference signal S(1,2)", dB(S(1,2)")=−19.313 at the peak frequency of 2.995 MHz. In other words, the interference for the receiver antenna 620 (Rx2") caused by the transmitter antenna Tx1 is significant.

Figure 6C:
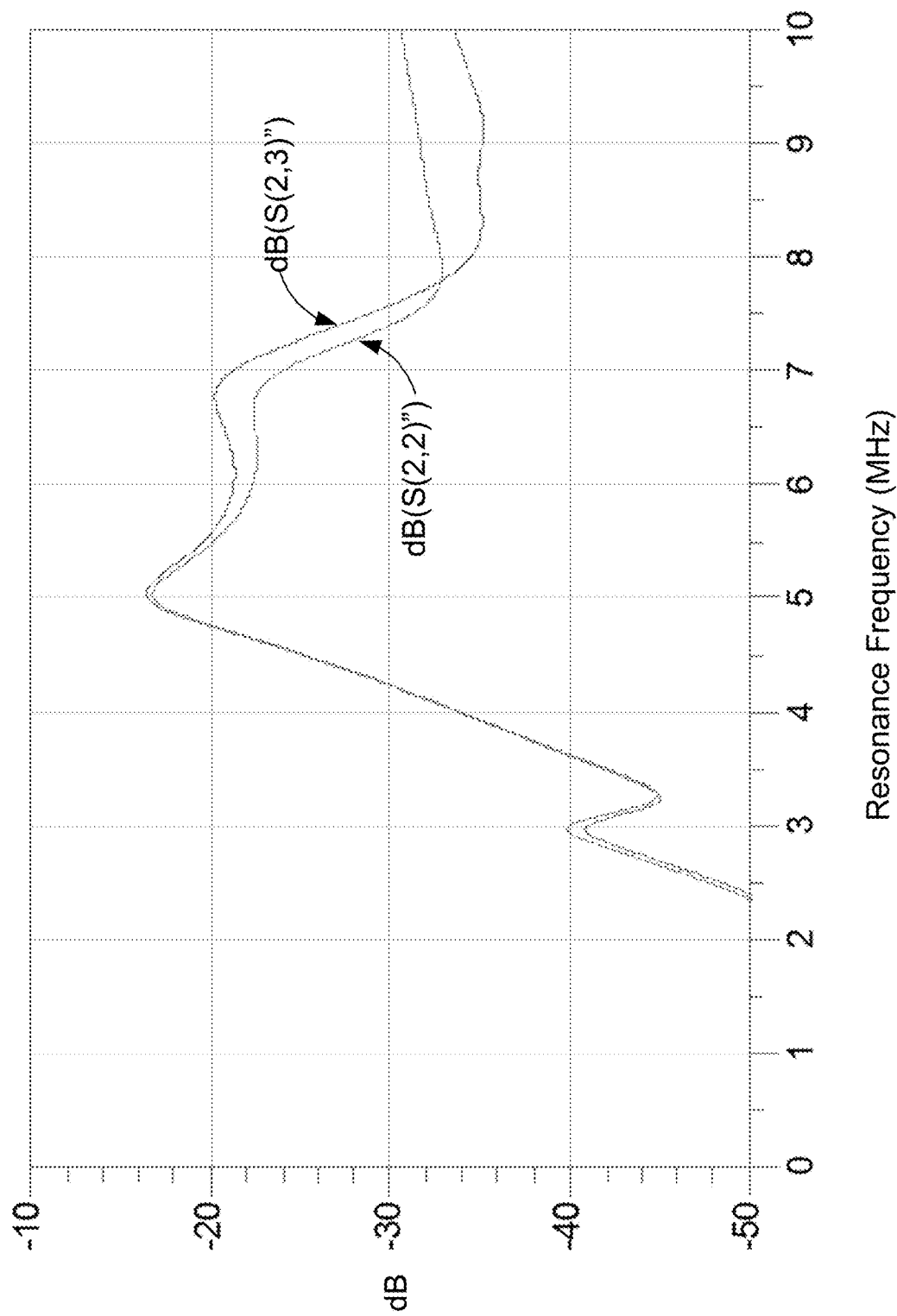
FIG. 6C shows a chart illustrating a relationship between a resonance frequency of the transmitter antenna Tx2 as shown in FIG. 4A to an induced dB of the interference signals of the receiver antennas as shown in FIG. 6A.

FIG. 6C shows a chart illustrating a relationship between a resonance frequency of the transmitter antenna Tx2 as shown in FIG. 4A to an induced dB of the interference signals of the receiver antennas as shown in FIG. 6A. As shown in FIG. 6C, two curves are obtained based on simulation to show the dB value of the signal S(2,2)" and the interference signal S(2,3)". Since the resonance frequency of the transmitter antenna Tx2 in this embodiment is $F_2=7$ MHz, the peak of each of the two curves is located around 7 MHz. Specifically, for the curve of the interference signal S(2,3)", dB(S(2,3)")=−19.937 at the peak frequency of 7.127 MHz. In other words, the interference for the receiver antenna 630 (Rx3") caused by the transmitter antenna Tx2 is significant.

Figure 6D:
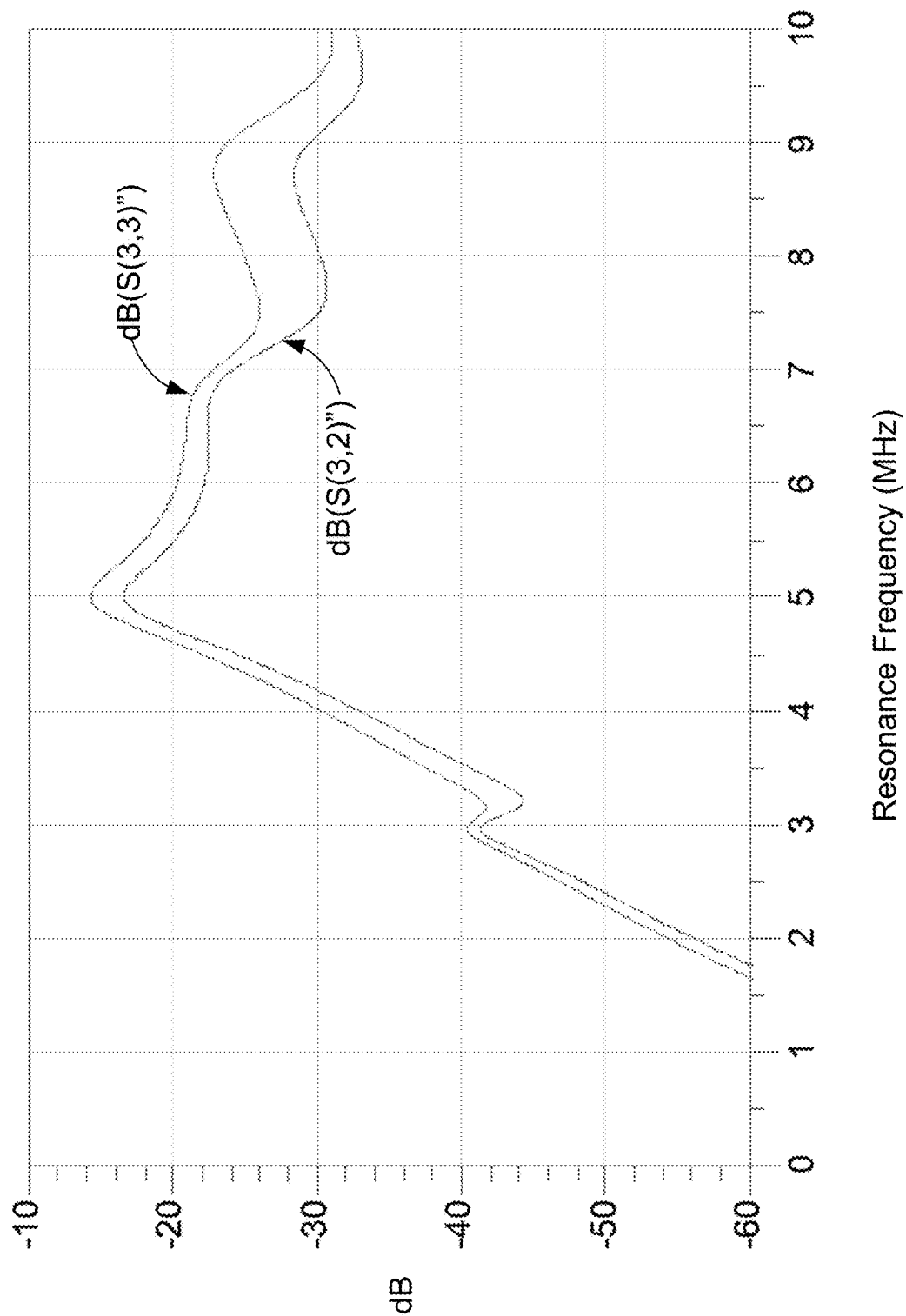
FIG. 6D shows a chart illustrating a relationship between a resonance frequency of the transmitter antenna Tx3 as shown in FIG. 4A to an induced dB of the interference signals of the receiver antennas as shown in FIG. 6A.

FIG. 6D shows a chart illustrating a relationship between a resonance frequency of the transmitter antenna Tx3 as shown in FIG. 4A to an induced dB of the interference signals of the receiver antennas as shown in FIG. 6A. As shown in FIG. 6D, two curves are obtained based on simulation to show the dB value of the signal S(3,3)" and the interference signal S(3,2)". Since the resonance frequency of the transmitter antenna Tx3 in this embodiment is $F_3=5$ MHz, the peak of each of the two curves is located around 5 MHz. Specifically, for the curve of the interference signal S(3,2)", dB(S(3,2)")=−16.545 at the peak frequency of 4.993 MHz. In other words, the interference for the receiver antenna 620 (Rx2") caused by the transmitter antenna Tx3 is significant.

Figure 6E:
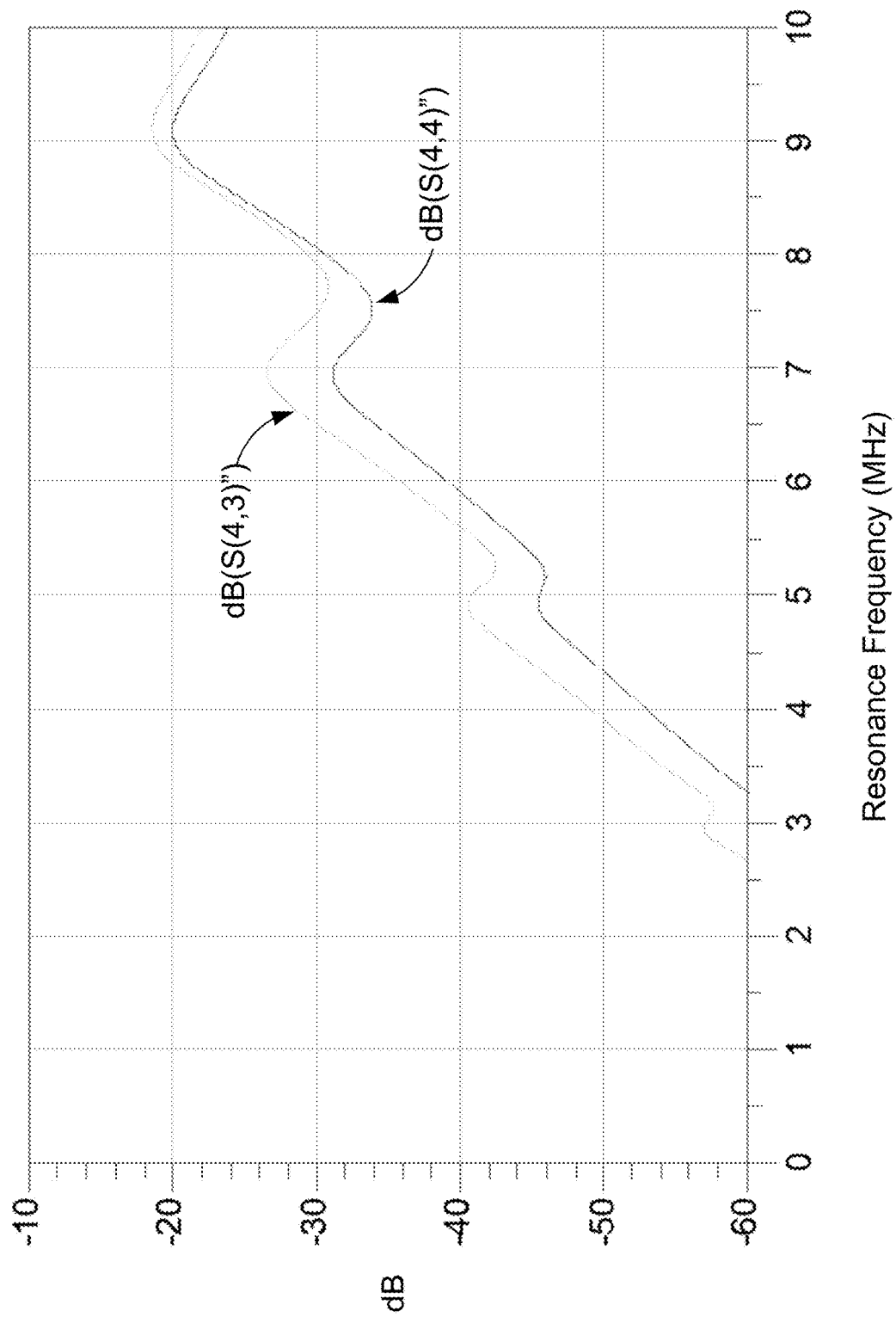
FIG. 6E shows a chart illustrating a relationship between a resonance frequency of the transmitter antenna Tx4 as shown in FIG. 4A to an induced dB of the interference signals of the receiver antennas as shown in FIG. 6A.

FIG. 6E shows a chart illustrating a relationship between a resonance frequency of the transmitter antenna Tx4 as shown in FIG. 4A to an induced dB of the interference signals of the receiver antennas as shown in FIG. 6A. As shown in FIG. 6E, two curves are obtained based on simulation to show the dB value of the signal S(4,4)" and the interference signal S(4,3)". Since the resonance frequency of the transmitter antenna Tx4 in this embodiment is $F_4=9$ MHz, the peak of each of the two curves is located around 9 MHz. Specifically, for the curve of the interference signal S(4,3)", dB(S(4,3)")=−15.904 at the peak frequency of 9.095 MHz. In other words, the interference for the receiver antenna 630 (Rx3") caused by the transmitter antenna Tx4 is significant.

As shown in FIGS. 6B, 6C, 6D and 6E, for the transmitter antenna loop group 410 as shown in FIG. 4A and the receiver antenna loop group 600 as shown in FIG. 6A, four interference signals remain significant. In other words, comparing to the receiver antenna loop group 420 as shown in FIG. 4B and the receiver antenna loop group 500 as shown in FIG. 5A, signal interference has been further reduced using the receiver antenna loop group 600 as shown in FIG. 6A.

Figure 7A:
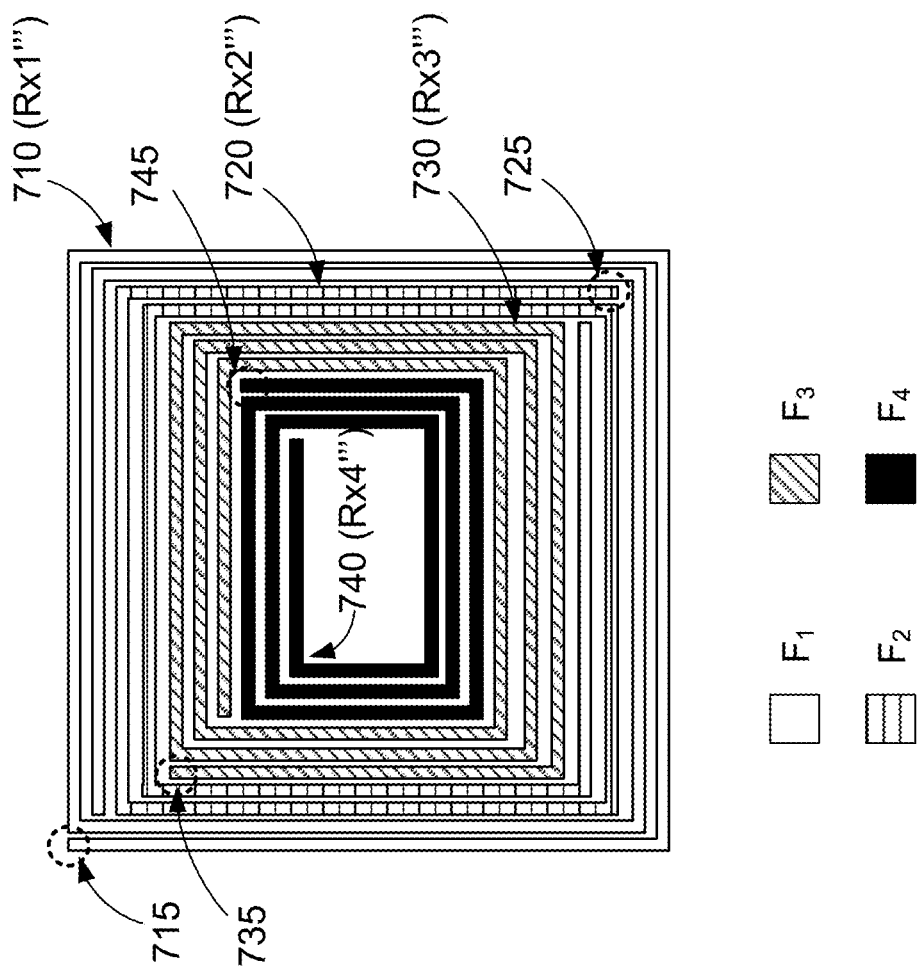
FIG. 7A schematically shows a receiver antenna loop group having four receiver antennas and corresponding to the transmitter antenna loop group as shown in FIG. 4A according to certain embodiments of the present disclosure.

In yet another embodiment, the structural arrangements of the receiver antennas Rx may be further changed in order to further reduce the signal interference between the wireless data transmission pairs Tx-Rx. FIG. 7A schematically shows a receiver antenna loop group having four receiver antennas and corresponding to the transmitter antenna loop group as shown in FIG. 4A according to certain embodiments of the present disclosure. As shown in FIG. 7A, the receiver antenna loop group 700 includes four receiver antennas 710, 720, 730 and 740 arranged in a substantially concentric manner. However, the structural arrangement of the four receiver antennas 610, 620, 630 and 640 are different from the four receiver antennas Rx1, Rx2, Rx3 and Rx4 as shown in FIG. 4B, the four receiver antennas 510, 520, 530 and 540 as shown in FIG. 5A, or the four receiver antennas 610, 620, 630 and 640 as shown in FIG. 6A. Specifically, as shown in FIG. 7A, the four receiver antennas 710, 720, 730 and 720 are sequentially arranged in different winding directions, where the outermost receiver antenna 710 winds from its outer feeding end inward to its inner feeding end in a counter-clockwise direction; the receiver antenna 720 is located inside the outermost receiver antenna 710, and winds from its outer feeding end inward to its inner feeding end in a counter-clockwise direction; the receiver antenna 730 is located inside the receiver antenna 720, and winds from its outer feeding end inward to its inner feeding end in a counter-clockwise direction; and the innermost receiver antenna 740 is located inside the receiver antenna 730, and winds from its outer feeding end inward to its inner feeding end in a clockwise direction. The inner diameter of the receiver antenna 710 is greater than the outer diameter of each of the receiver antennas 720, 730 and 740. The inner diameter of the receiver antenna 720 is greater than the outer diameter of each of the receiver antennas 730 and 740. The inner diameter of the receiver antenna 730 is greater than the outer diameter of the receiver antenna 740.

Moreover, the feeding ends of the four receiver antennas 710, 720, 730 and 740 of the receiver antenna loop group 700 as shown in FIG. 7A are not adjacent to one another. Specifically, all of the feeding ends 715, 725, 735 and 745 of the receiver antennas 710, 720, 730 and 740 are the outer feeding ends. However, the feeding end 715 of the receiver antenna 710 and the feeding end 735 of the receiver antenna 730 are located at the top-left corner of the receiver antenna loop group 700, the feeding end 725 of the receiver antenna 720 is located at the bottom-right corner of the receiver antenna loop group 700, and the feeding end 745 of the receiver antenna 740 is located at the top-right corner of the receiver antenna loop group 700. For the two feeding ends 715 and 735 that are located at the same top-left corner, there are segments of the receiver antennas located between the feeding end 715 of the receiver antenna 710 and the feeding end 735 of the receiver antenna 730. Therefore, the feeding ends 715, 725, 735 and 745 of the receiver antennas 710, 720, 730 and 740 of the receiver antenna loop group 700 as shown in FIG. 7A are not adjacent to one another.

Further, the resonance frequencies of the receiver antennas 710, 720, 730 and 740 of the receiver antenna loop group 700 as shown in FIG. 7A are also different from the resonance frequencies of the receiver antennas Rx1, Rx2, Rx3 and Rx4 of the receiver antenna loop group 420 as shown in FIG. 4B. Specifically, in a sequence from the outermost receiver antenna 710 toward the innermost receiver antenna 740, the receiver antenna 710 has the resonance frequency $F_1=3$ MHz, the receiver antenna 720 has the resonance frequency $F_2=7$ MHz, the receiver antenna 730 has the resonance frequency $F_3=9$ MHz, and the receiver antenna 740 has the resonance frequency $F_4=5$ MHz. Thus, for the four receiver antennas 610, 620, 630 and 640 of the receiver antenna loop group 600 as shown in FIG. 6A, $F_3>F_2>F_4>F_1$. In other words, in a sequence from the outermost receiver antenna 710 toward the innermost receiver antenna 740, the resonance frequencies are neither gradually increasing nor gradually decreasing. Moreover, the four transmitter antennas Tx1, Tx2, Tx3 and Tx4 of the transmitter antenna loop group 410 one-to-one correspond to the four receiver antennas 710, 720, 730 and 740 of the receiver antenna loop group 700, so the resonance frequencies of the four transmitter antennas Tx1, Tx2, Tx3 and Tx4 of the transmitter antenna loop group 410 also has to be adjusted. Specifically, the receiver antenna 710 functions as a corresponding receiver antenna Rx1''' to the transmitter antenna Tx1, so the resonance frequency of the transmitter antenna Tx1 remains $F_1=3$ MHz; the receiver antenna 720 functions as a corresponding receiver antenna Rx2''' to the transmitter antenna Tx2, so the resonance frequency of the transmitter antenna Tx2 is correspondingly adjusted to $F_2=7$ MHz; the receiver antenna 730 functions as a corresponding receiver antenna Rx3''' to the transmitter antenna Tx3, so the resonance frequency of the transmitter antenna Tx3 is correspondingly adjusted to $F_3=9$ MHz; and the receiver antenna 740 functions as a corresponding receiver antenna Rx4''' to the transmitter antenna Tx4, so the resonance frequency of the transmitter antenna Tx4 is correspondingly adjusted to $F_4=5$ MHz.

Comparing the receiver antenna loop group 700 as shown in FIG. 7A to the receiver antenna loop group 420 as shown in FIG. 4B, the receiver antenna loop group 500 as shown in FIG. 5A and the receiver antenna loop group 600 as shown in FIG. 6A, signal interference is further reduced between the transmitter antenna loop group 410 and the receiver antenna loop group 700. To describe the signals being transmitted between the transmitter antenna loop group 410 and the receiver antenna loop group 700, the signal transmitted from the transmitter antenna Txm to the receiver antenna Rxn''' is labeled as S(m,n)''', where each of m and n is an integer selected from 1-4. For example, S(2,3)''' indicates the interference signal transmitted from the transmitter antenna Tx2 to the receiver antenna 730 (Rx3'''). Other labels of the signals are not herein elaborated.

Figure 7B:
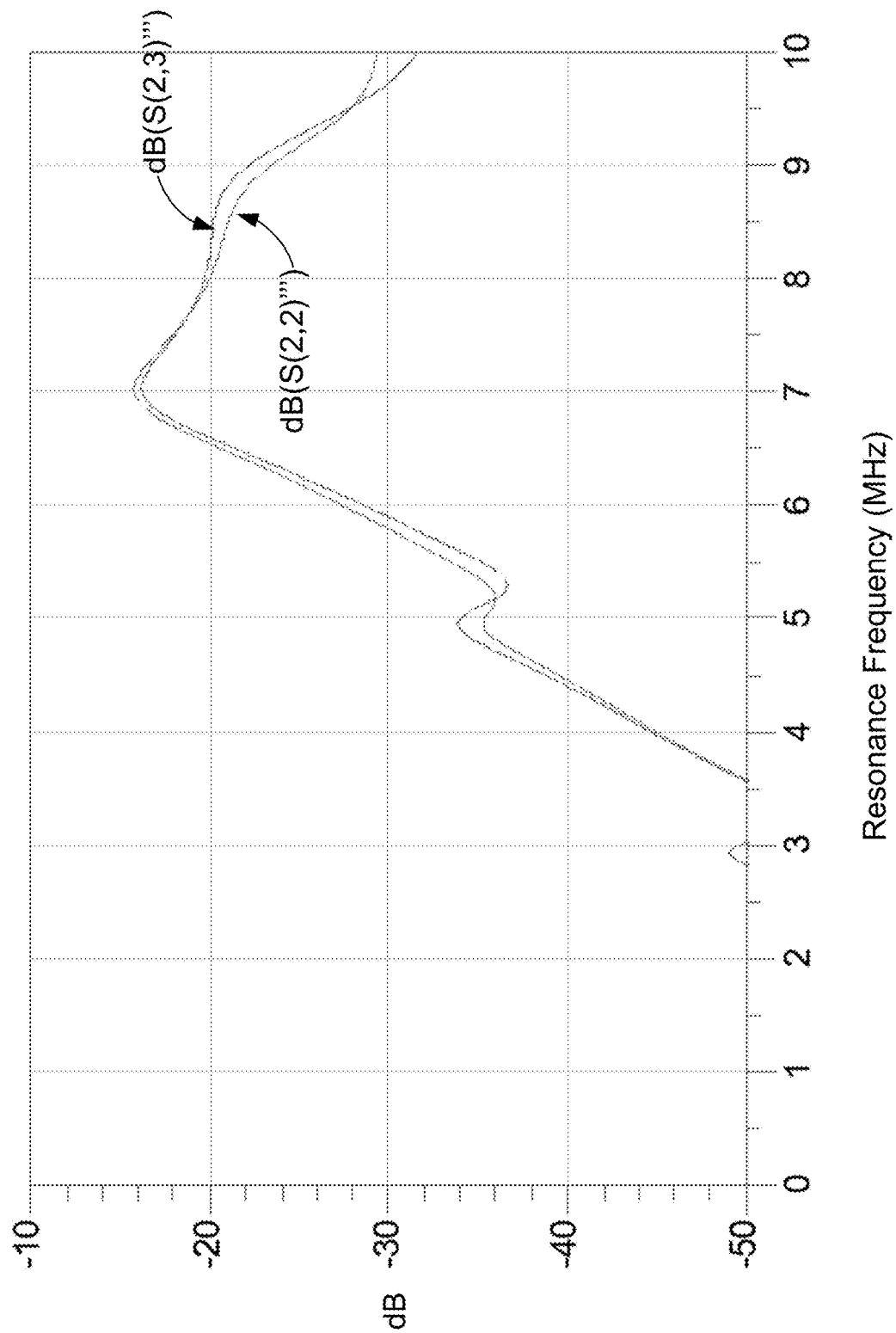
FIG. 7B shows a chart illustrating a relationship between a resonance frequency of the transmitter antenna Tx2 as shown in FIG. 4A to an induced dB of the interference signals of the receiver antennas as shown in FIG. 7A.

FIG. 7B shows a chart illustrating a relationship between a resonance frequency of the transmitter antenna Tx2 as shown in FIG. 4A to an induced dB of the interference signals of the receiver antennas as shown in FIG. 7A. As shown in FIG. 7B, two curves are obtained based on simulation to show the dB value of the signal S(2,2)''' and the interference signal S(2,3)'''. Since the resonance frequency of the transmitter antenna Tx2 in this embodiment is $F_2=7$ MHz, the peak of each of the two curves is located around 7 MHz. Specifically, for the curve of the interference signal S(2,3)''', dB(S(2,3)''')=−16.257 at the peak frequency of 7.059 MHz. In other words, the interference for the receiver antenna 730 (Rx3''') caused by the transmitter antenna Tx2 is significant.

Figure 7C:
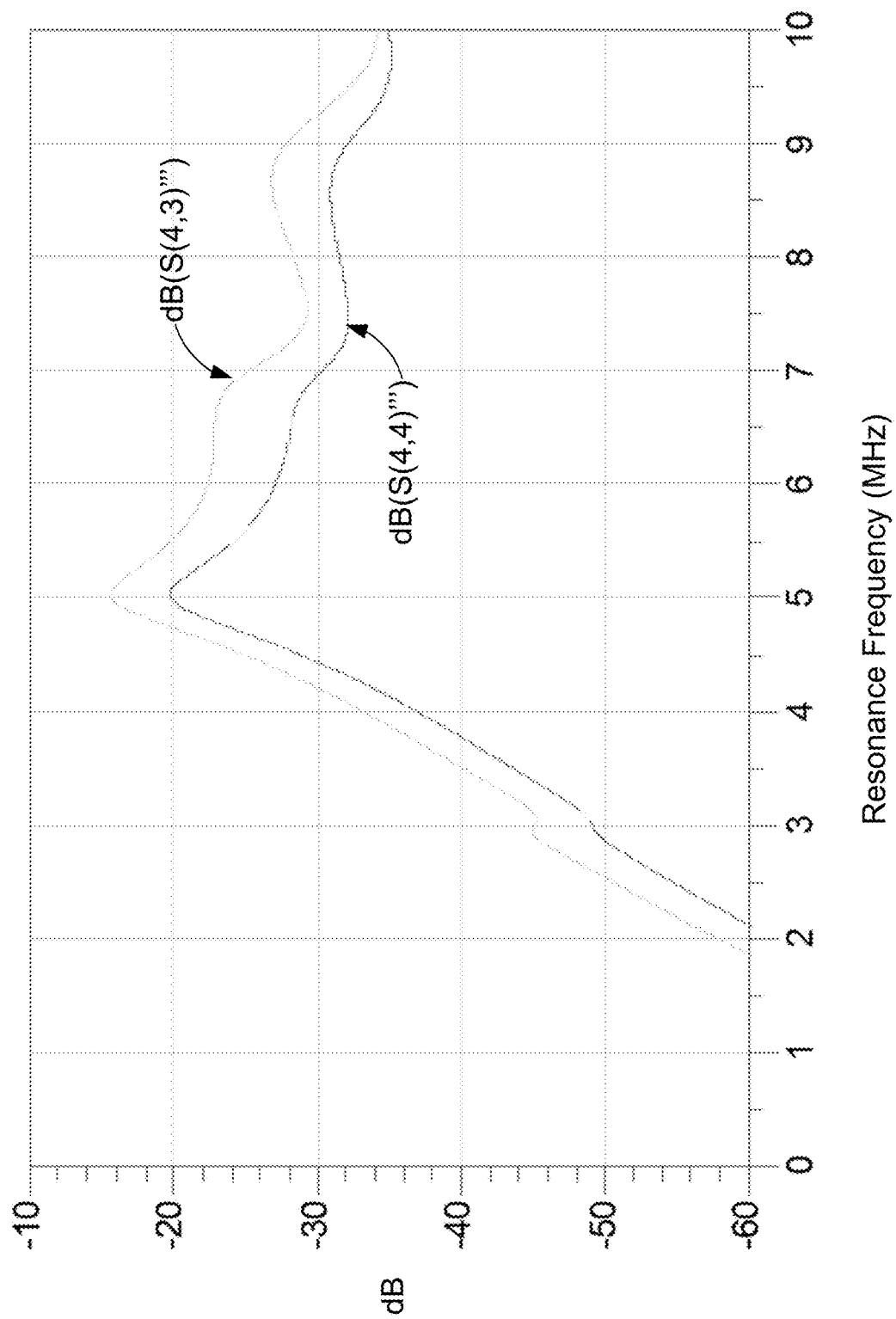
FIG. 7C shows a chart illustrating a relationship between a resonance frequency of the transmitter antenna Tx4 as shown in FIG. 4A to an induced dB of the interference signals of the receiver antennas as shown in FIG. 7A.

FIG. 7C shows a chart illustrating a relationship between a resonance frequency of the transmitter antenna Tx4 as shown in FIG. 4A to an induced dB of the interference signals of the receiver antennas as shown in FIG. 7A. As shown in FIG. 7C, two curves are obtained based on simulation to show the dB value of the signal S(4,4)+'' and the interference signal S(4,3)'''. Since the resonance frequency of the transmitter antenna Tx4 in this embodiment is $F_4=5$ MHz, the peak of each of the two curves is located around 5 MHz. Specifically, for the curve of the interference signal S(4,3)''', dB(S(4,3)''')=−15.723 at the peak frequency of 5.047 MHz. In other words, the interference for the receiver antenna 730 (Rx3''') caused by the transmitter antenna Tx4 is significant.

As shown in FIGS. 7B and 7C, for the transmitter antenna loop group 410 as shown in FIG. 4A and the receiver antenna loop group 700 as shown in FIG. 7A, only two interference signals remain significant. In other words, comparing to the receiver antenna loop group 420 as shown in FIG. 4B, the receiver antenna loop group 500 as shown in FIG. 5A and the receiver antenna loop group 600 as shown in FIG. 6A, signal interference has been further reduced using the receiver antenna loop group 700 as shown in FIG. 7A.

In each of the embodiments as shown in FIGS. 4B, 5A, 6A and 7A, the resonance frequency $F_1$ of the outermost receiver antenna is less than the resonance frequencies $F_2$, $F_3$ and $F_4$ of the other three inner receiver antennas. In other words, the outermost receiver antenna has the lowest resonance frequency. Further, in the sequence from the outermost receiver antenna toward the innermost receiver antenna, the resonance frequency $F_2$ of the second receiver antenna is greater than one of the resonance frequencies $F_3$ and $F_4$ of the third and the fourth receiver antennas, and less than the other of the resonance frequencies $F_3$ and $F_4$ of the third and the fourth receiver antennas.

In each of the embodiments as shown in FIGS. 4B, 5A, 6A and 7A, the receiver antenna loop group includes four receiver antennas. In certain embodiments, the receiver antenna loop group may include P receiver antennas, where P is a positive integer greater than or equal to 3, as long as the resonance frequencies of the P receiver antennas of the receiver antenna loop group, in a sequence from an outermost receiver antenna toward an innermost receiver antenna, are neither gradually increasing nor gradually decreasing.

It should be noted that the structures of the receiver antennas in the receiver antenna loop groups as shown in FIGS. 4B, 5A, 6A and 7A are merely provided as embodiments of the disclosure, and the structural arrangements of the receiver antennas Rx may be further changed in order to further reduce the signal interference between the wireless data transmission pairs Tx-Rx. For example, in certain embodiments, the feeding ends of all of the receiver antennas may be located at a same corner of the receiver antennas, as long as at least one of the feeding ends of the receiver antennas is an outer feeding end, and at least one of the feeding ends of the receiver antennas is an inner feeding end. In this case, the feeding ends of the receiver antennas are not adjacent to one another. In certain embodiments, the feeding ends of the receiver antennas may be located at two or more different corners of the receiver antennas, such that the feeding ends of the receiver antennas are not adjacent to one another.

Figure 8:
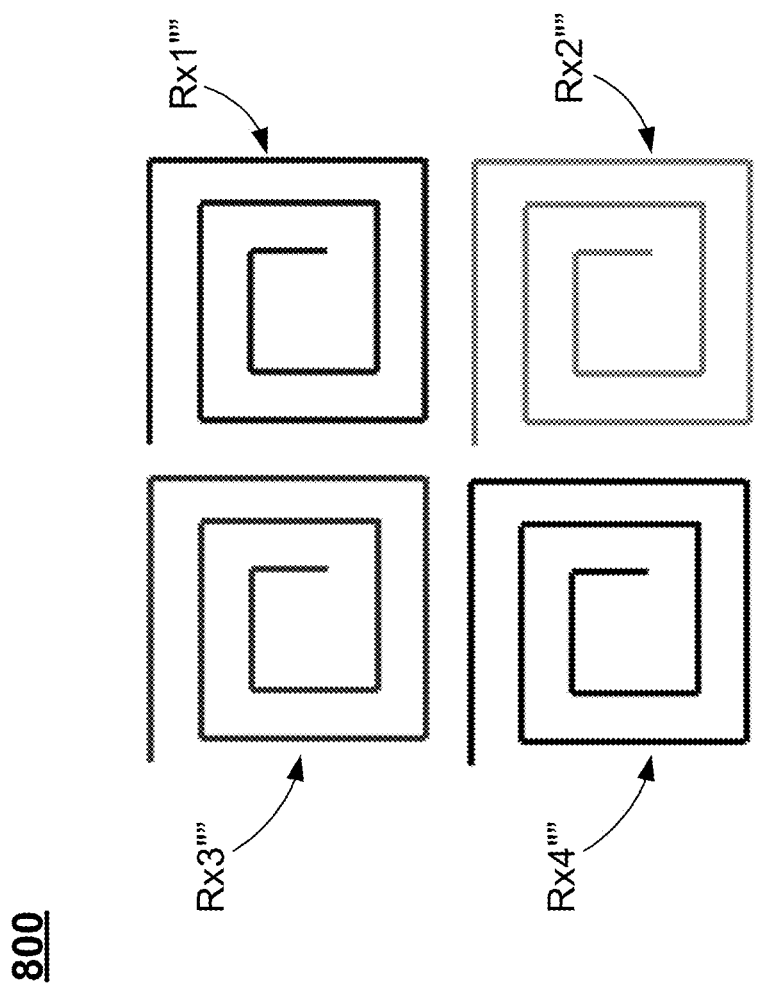
FIG. 8 schematically shows a transmitter antenna loop group having four transmitter antennas arranged in a tile pattern array according to certain embodiments of the present disclosure.

In each of the embodiments as shown in FIGS. 4B, 5A, 6A and 7A, the structures of the receiver antennas in the receiver antenna loop group are arranged in a concentric manner. However, in certain embodiments, the structure of the receiver antenna loop group may also be adjusted such that the receiver antennas in the receiver antenna loop group are not arranged in the concentric manner. For example, FIG. 8 schematically shows a receiver antenna loop group having four receiver antennas arranged in a tile pattern according to certain embodiments of the present disclosure. As shown in FIG. 8, the receiver antenna loop group 800 has four transmitter antennas Rx1'''', Rx2'''', Rx3'''' and Rx4'''' arranged in a 2*2 tile pattern. In this case, the four receiver antennas Rx1'''', Rx2'''', Rx3'''' and Rx4'''' are not arranged in a concentric manner, and the outer diameter of each of the four receiver antennas Rx1'''', Rx2'''', Rx3'''' and Rx4'''' will be reduced such that the four receiver antennas Rx1'''', Rx2'''', Rx3'''' and Rx4'''' maintain one-to-one corresponding to the four transmitter antennas Tx1, Tx2, Tx3 and Tx4 of the receiver antenna loop group 410 as shown in FIG. 4A. In other words, the outer diameter of each of the four transmitter antennas Tx1, Tx2, Tx3 and Tx4 of the transmitter antenna loop group 410 may be greater than the outer diameter of each of the four receiver antennas Rx1'''', Rx2'''', Rx3'''' and Rx4'''' of the receiver antenna loop group 800.

Figure 9:
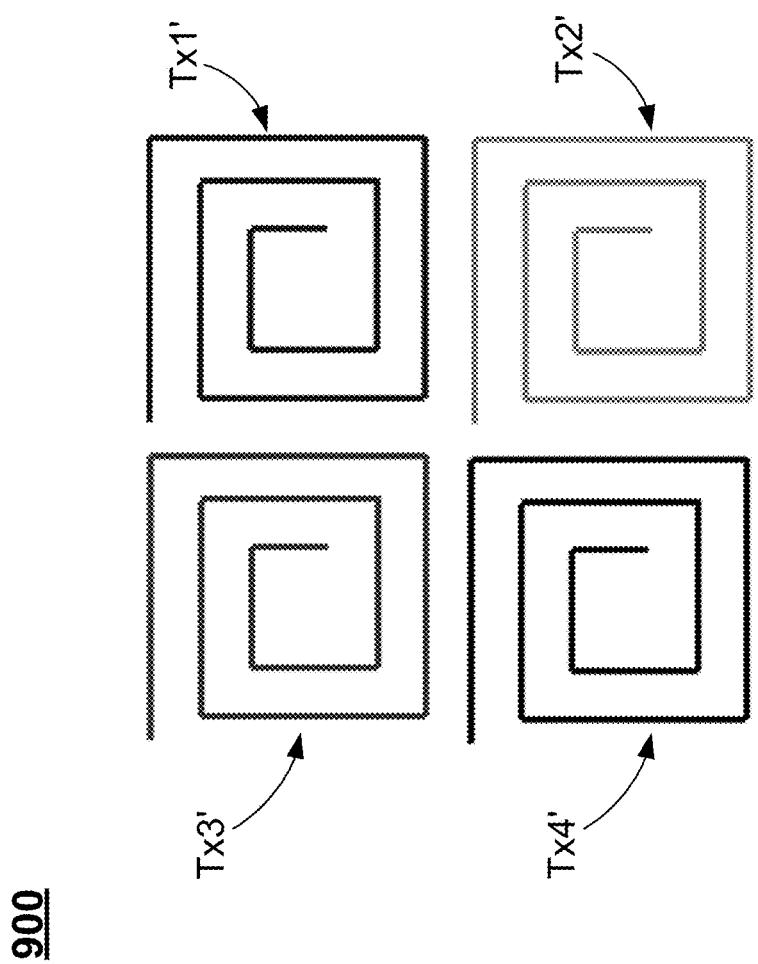
FIG. 9 schematically shows a transmitter antenna loop group having four transmitter antennas arranged in a tile pattern array according to certain embodiments of the present disclosure.

On the other hand, in certain embodiments, the structure of the transmitter antenna loop group may also be adjusted to correspond to the structures of the receiver antennas in the receiver antenna loop groups as shown in FIGS. 4B, 5A, 6A and 7A. For example, FIG. 9 schematically shows a transmitter antenna loop group having four transmitter antennas arranged in a tile pattern according to certain embodiments of the present disclosure. As shown in FIG. 9, the transmitter antenna loop group 900 has four transmitter antennas Tx1', Tx2', Tx3' and Tx4' arranged in a 2*2 tile pattern. In this case, the four transmitter antennas Tx1', Tx2', Tx3' and Tx4' are not arranged in a concentric manner, and the outer diameter of each of the four transmitter antennas Tx1', Tx2', Tx3' and Tx4' will be reduced such that the four transmitter antennas Tx1', Tx2', Tx3' and Tx4' maintain one-to-one corresponding to the four receiver antennas of the receiver antenna loop group in any of the embodiments as shown in FIGS. 4B, 5A, 6A and 7A. In other words, the outer diameter of each of the four receiver antennas of the receiver antenna loop group may be greater than the outer diameter of each of the four transmitter antennas Tx1', Tx2', Tx3' and Tx4' of the transmitter antenna loop group 900. However, the transmitter antenna loop group 900 cannot correspond to the receiver antenna loop group 800 as shown in FIG. 8.

Figure 10:
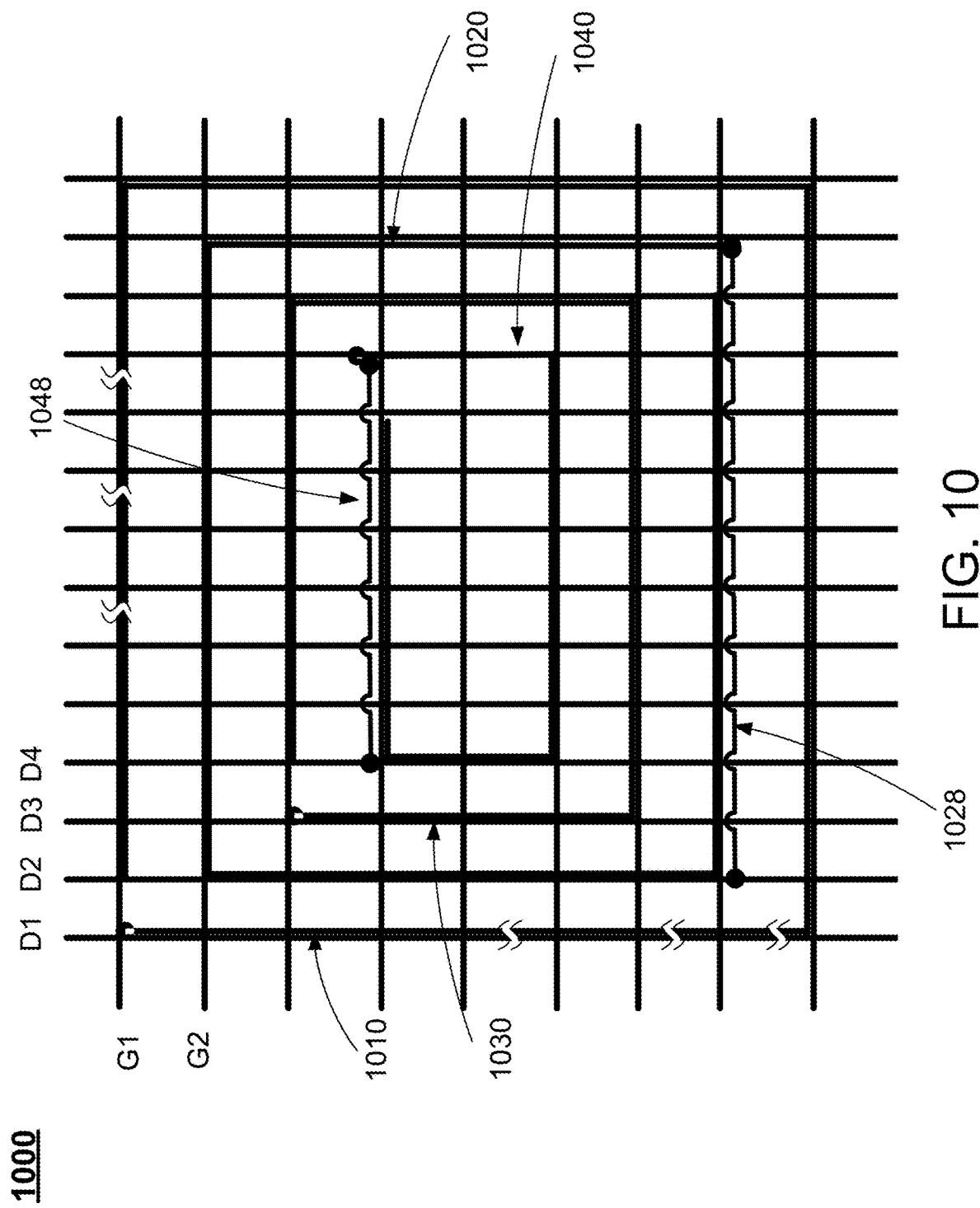
FIG. 10 schematically shows connections between a plurality of receiver antennas and corresponding data lines according to certain embodiments of the present disclosure.

As described above, in certain embodiments, the feeding ends of the receiver antennas may be located at two or more different corners of the receiver antennas, such that the feeding ends of the receiver antennas are not adjacent to one another. In this case, however, the locations of the feeding ends of some of the receiver antennas may be distanced from the corresponding signal lines, and bridge lines may be required to electrically connect the feeding ends of these receiver antennas to the corresponding signal lines. For example, FIG. 10 schematically shows connections between a plurality of receiver antennas and corresponding data lines according to certain embodiments of the present disclosure. As shown in FIG. 10, the pixel structure 1000 includes multiple data lines D1, D2, D3, D4, . . . from left to right, and multiple gate lines G1, G2, . . . from top to bottom. Correspondingly, a receiver antenna loop group having four receiver antennas 1010, 1020, 1030 and 1040 arranged in a substantially concentric manner are also provided. Specifically, the feeding end of the receiver antenna 1010 is located closed to the corresponding data line D1, and the feeding end of the receiver antenna 1030 is located closed to the corresponding data line D3. Therefore, no bridge lines are required for the receiver antennas 1010 and 1030. On the other hand, the feeding end of the receiver antenna 1020 is located away from the corresponding data line D2, and a bridge line 1028 is provided to connect the feeding end of the receiver antenna 1020 to the corresponding data line D2. Similarly, the feeding end of the receiver antenna 1040 is located away from the corresponding data line D4, and a bridge line 1048 is provided to connect the feeding end of the receiver antenna 1040 to the corresponding data line D4. As used herein, the bridge lines are parallel to the gate lines, and could formed by a metal layer. Each bridge line has two ends, one end connected to a feeding end of the receiver antenna through a via, and the other end connected to a corresponding data line through a corresponding via. Moreover, the data lines and the gate lines are made by metal layers respectively, where the metal layer is different from the layer of the data lines and the layer of the gate lines. In a certain embodiment, the gate lines are made by a first metal layer, the data lines are made by a second metal layer, and the bridge lines are made by a third metal layer. The first metal layer, the second metal layer, and the third metal layer are disposed in a substrate in order.

Figure 11:
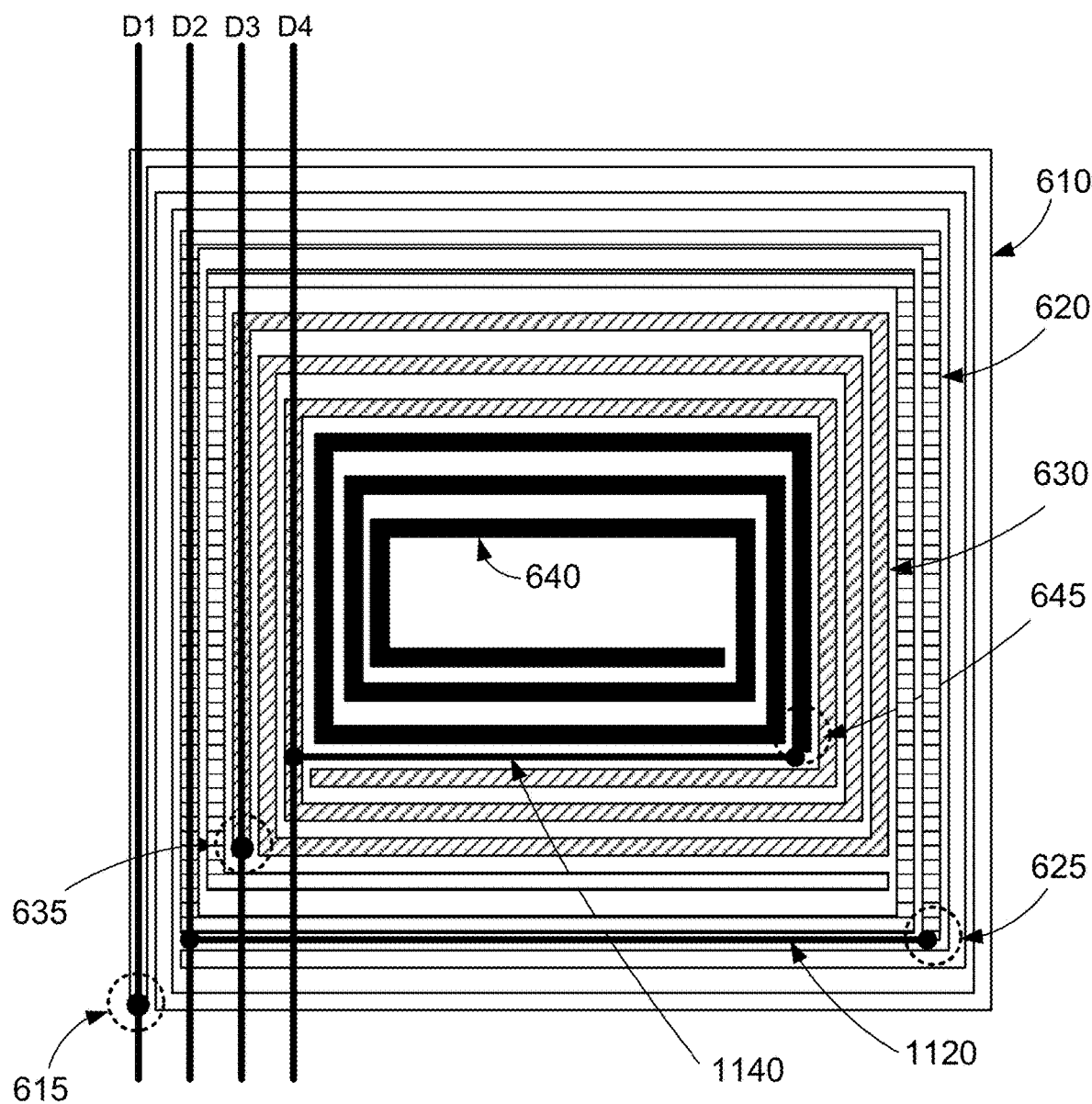
FIG. 11 schematically shows connections between the receiver antenna loop group as shown in FIG. 6A and corresponding data lines according to certain embodiments of the present disclosure.

FIG. 11 schematically shows connections between the receiver antenna loop group as shown in FIG. 6A and corresponding data lines according to certain embodiments of the present disclosure. As shown in FIG. 11, the pixel structure 1100 includes four data lines D1, D2, D3 and D4 and a receiver antenna loop group. The structure of the receiver antenna loop group is identical to the receiver antenna loop group 600 as shown in FIG. 6A, and the four data lines D1, D2, D3 and D4 respectively correspond to the four receiver antennas 610, 620, 630 and 640. Specifically, the feeding end 615 of the receiver antenna 610 is located closed to the corresponding data line D1, and the feeding end 635 of the receiver antenna 630 is located closed to the corresponding data line D3. Therefore, no bridge lines are required for the receiver antennas 610 and 630. On the other hand, the feeding end 625 of the receiver antenna 620 is located away from the corresponding data line D2, and a bridge line 1120 is provided to connect the feeding end 625 of the receiver antenna 620 to the corresponding data line D2. Similarly, the feeding end 645 of the receiver antenna 640 is located away from the corresponding data line D4, and a bridge line 1140 is provided to connect the feeding end 645 of the receiver antenna 640 to the corresponding data line D4.

Figure 12A:
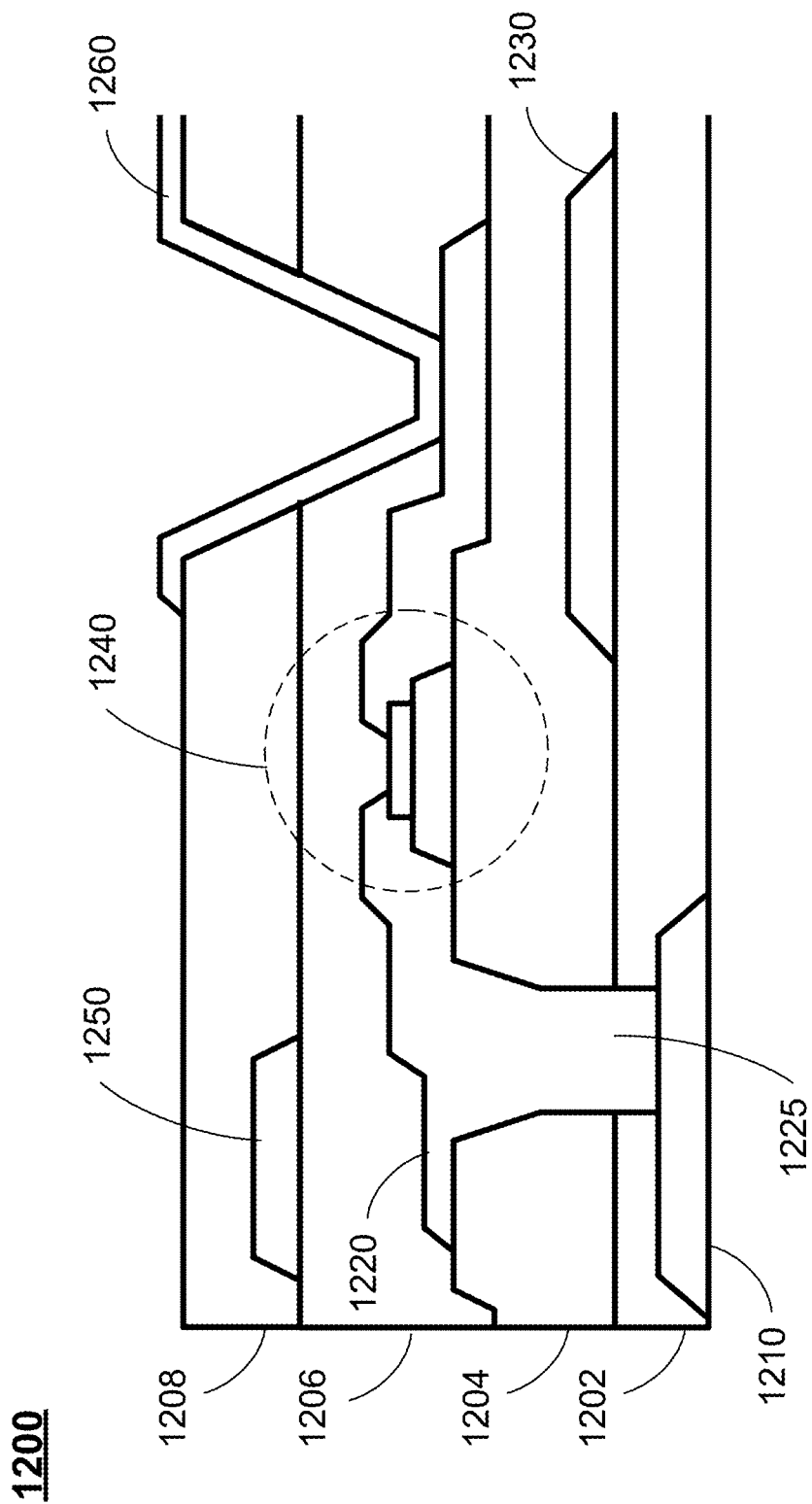
FIG. 12A schematically shows a partial sectional view of the pixel structure and the receiver antenna according to certain embodiments of the present disclosure, where no bridge line is required.
Figure 12B:
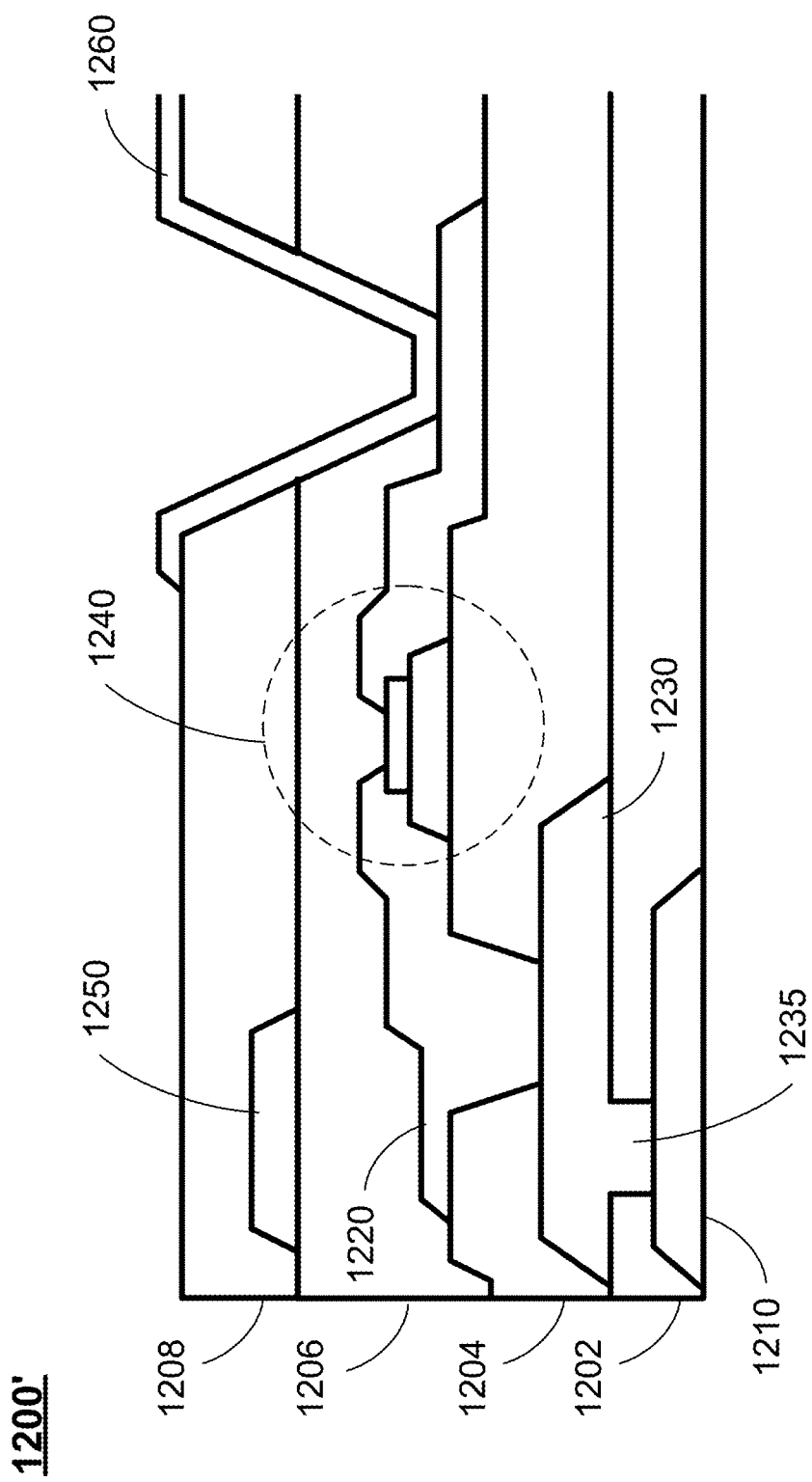
FIG. 12B schematically shows a partial sectional view of the pixel structure and the receiver antenna according to certain embodiments of the present disclosure, where a bridge line is required to connect the receiver antenna and the data line.
Figure 12C:
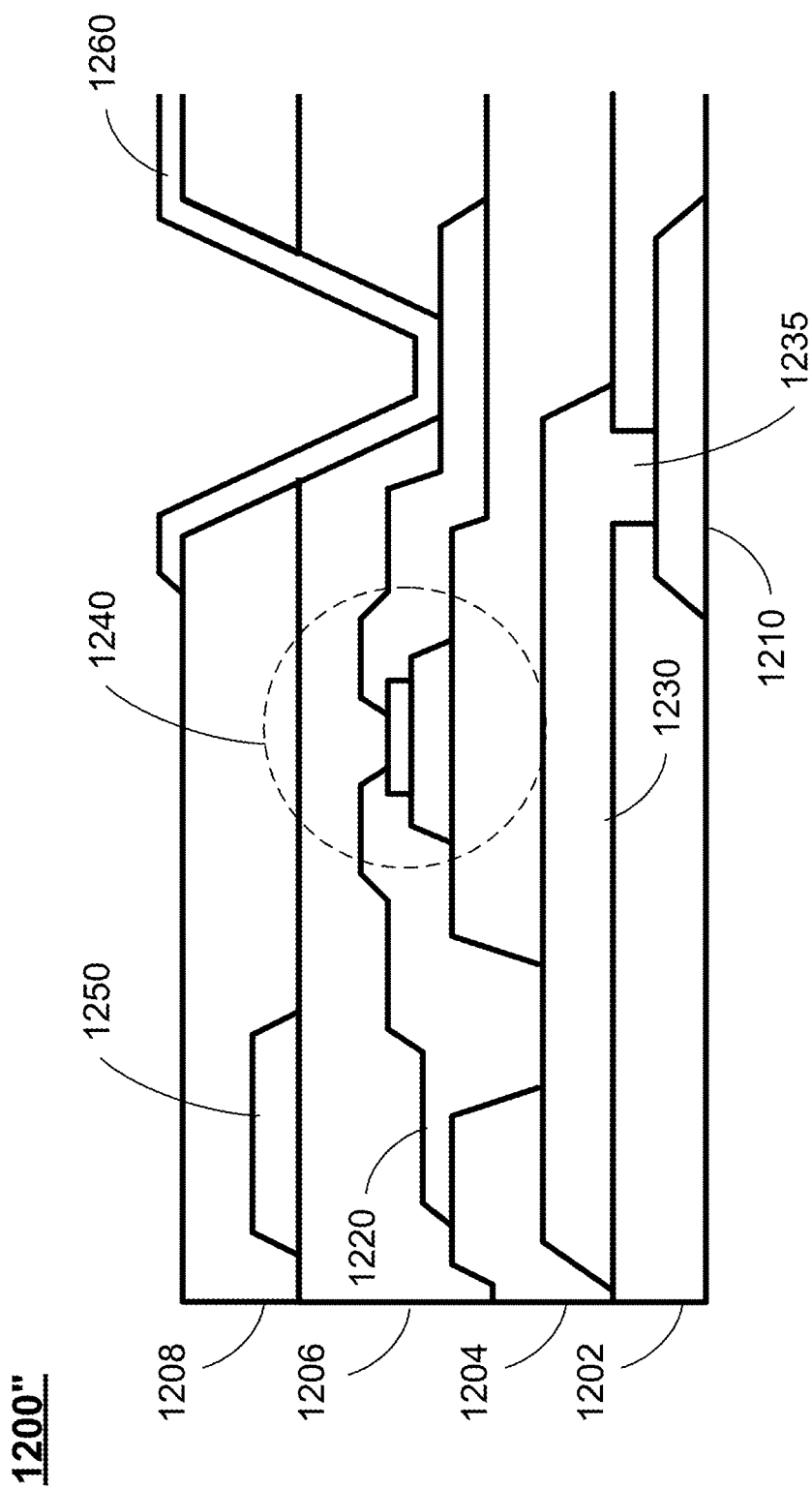
FIG. 12C schematically shows a partial sectional view of the pixel structure and the receiver antenna according to certain embodiments of the present disclosure, where a bridge line is required to connect the receiver antenna and the data line.

FIGS. 12A, 12B and 12C schematically show a plurality of partial sectional views of the pixel structure and the receiver antenna according to certain embodiments of the present disclosure. Specifically, FIG. 12A shows a partial sectional view of the structure 1200, which includes a receiver antenna 1210, a data line 1220, a metal layer 1230 functioning as the bridge line, a transistor 1240 forming the pixel, a ground electrode 1250, a common electrode 1260, and multiple insulating layers 1202, 1204, 1206 and 1208 between other layers. As shown in FIG. 12A, when no bridge line is required between the data line 1220 and the receiver antenna 1210, the metal layer 1230 does not extend to the location between the data line 1220 and the receiver antenna 1210, allowing a via 1225 to be formed in the insulating layers 1202 and 1204 such that the data line 1220 and the receiver antenna 1210 may be electrically connected through the via 1225.

In comparison, FIG. 12B shows a similar structure 1200' to the structure 1200 as shown in FIG. 12A. The only difference between the structure 1200' as shown in FIG. 12B and the structure 1200 as shown in FIG. 12A exists in that the metal layer 1230 in FIG. 12B extends to the location between the data line 1220 and the receiver antenna 1210, such that the data line 1220 is electrically connected to the metal layer 1230, and a via 1235 is formed in the insulating layer 1202 such that the metal layer 1230 and the receiver antenna 1210 may be electrically connected through the via 1235. In this case, the metal layer 1230 may function as the bridge line.

FIG. 12B shows a similar structure 1200" to the structure 1200' as shown in FIG. 12B. The only difference between the structure 1200" as shown in FIG. 12C and the structure 1200' as shown in FIG. 12B exists in that the location of the receiver antenna 1210 is away from the data line 1220 in a vertical direction, and the metal layer 1230 further extends to align to both the data line 1220 and the receiver antenna 1210. In this case, the data line 1220 is electrically connected to the metal layer 1230, and a via 1235 is formed in the insulating layer 1202 such that the metal layer 1230 and the receiver antenna 1210 may be electrically connected through the via 1235. In this case, the metal layer 1230 may function as the bridge line.

Figure 13A:
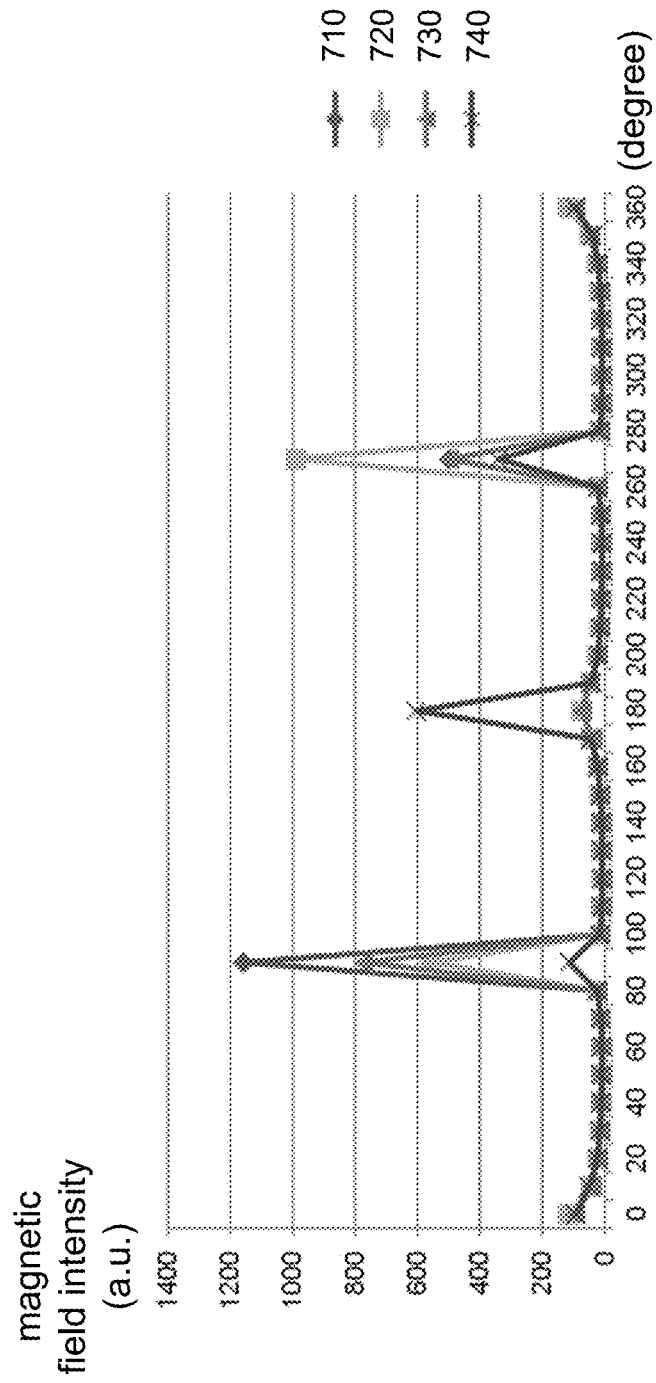
FIG. 13A shows a chart illustrating a relationship between the degree of the receiver antennas to the magnetic field intensity of the receiver antennas as shown in FIG. 7A according to certain embodiments of the present disclosure.
Figure 13B:
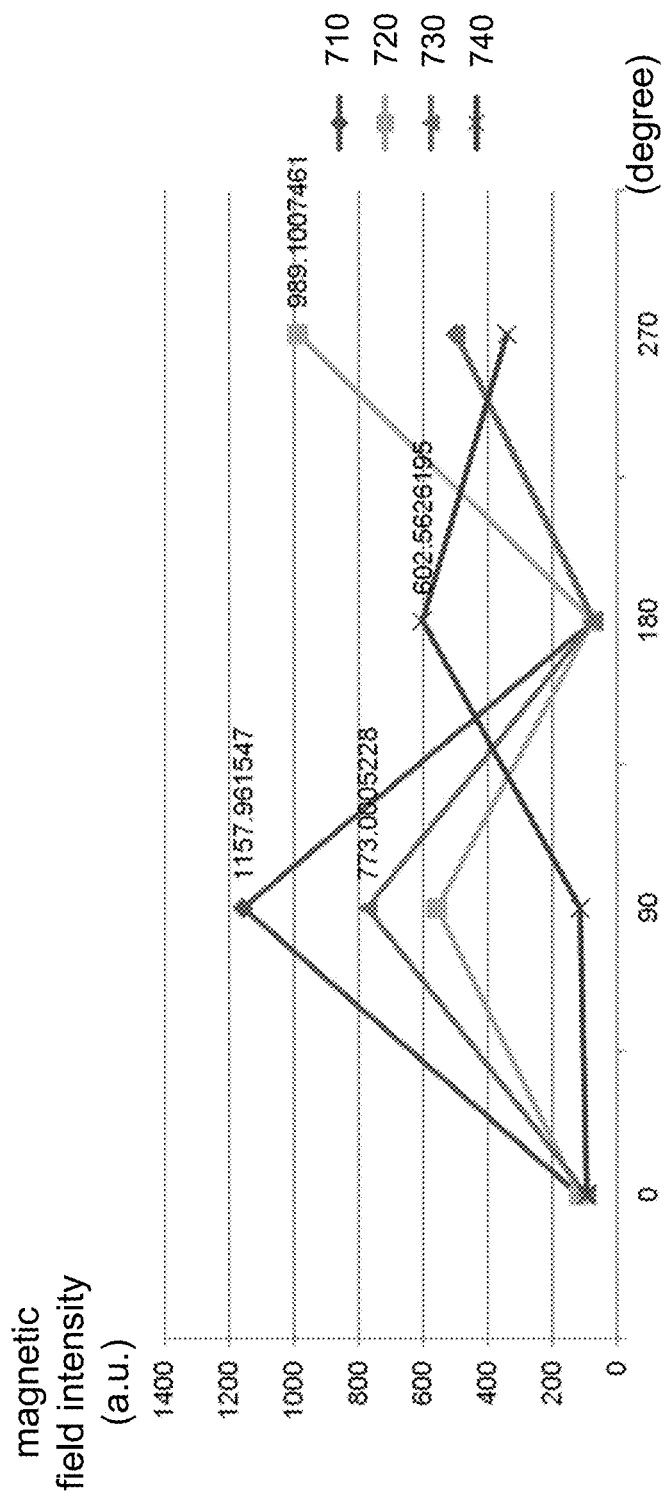
FIG. 13B shows a line graph of FIG. 13A, showing the magnetic field intensities of the receiver antennas at the four corners of the receiver antennas.

The inventors have performed experiments and simulations to the receiver antennas according to certain embodiments of the disclosure to show the magnetic field intensities of the receiver antennas. For example, FIG. 13A shows a chart illustrating a relationship between the degree of the receiver antennas to the magnetic field intensity of the receiver antennas as shown in FIG. 7A according to certain embodiments of the present disclosure, and FIG. 13B shows a line graph of FIG. 13A, showing the magnetic field intensities of the receiver antennas at the four corners of the receiver antennas. Specifically, for the receiver antennas 710, 720, 730 and 740 as shown in FIG. 7A, the degrees as shown in FIGS. 13A and 13B are determined using a polar coordinate system using clockwise orientation, with the bottom-left corner of each receiver antenna being designated as 0°. In this case, the top-left corner of each receiver antenna is designated as 90°, the top-right corner of each receiver antenna is designated as 180°, and the bottom-right corner of each receiver antenna is designated as 270°.

As shown in FIGS. 13A and 13B, for the outermost receiver antenna 710, the peak value (1157.961547 a.u.) of the magnetic field intensity occurs at 90°, where the feeding end 715 is located. For the second receiver antenna 720, the peak value (989.1007461 a.u.) of the magnetic field intensity occurs at 270°, where the feeding end 725 is located. For the third receiver antenna 730, the peak value (773.0005228 a.u.) of the magnetic field intensity occurs at 90°, where the feeding end 735 is located. For the innermost receiver antenna 740, the peak value (602.5626195 a.u.) of the magnetic field intensity occurs at 180°, where the feeding end 745 is located. It should be noted that, for each receiver antenna, the magnetic field intensity peaks at the corresponding feeding end. Further, the peak value of the magnetic field intensity of the outermost receiver antenna 710 is greater than those of the other three receiver antennas 720, 730 and 740, and the peak value of the magnetic field intensity of the innermost receiver antenna 740 is less than those of the other three receiver antennas 710, 720 and 730. In other words, the peak value of the magnetic field intensity of each receiver antenna is related to the total length of the segments of each receiver antenna.

The embodiments of the antennas as described above may be used in different types of wireless display panels and/or display apparatuses. Further, The embodiments as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
   a pixel structure corresponding to a display area, comprising a plurality of pixels arranged in an array having M columns and N rows, wherein M and N are positive integers;
   a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas;

wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3;

wherein the P receiver antennas of each of the receiver antenna loop groups are arranged to be concentric, and the P transmitter antennas of the corresponding one of the transmitter antenna loop groups are arranged to be concentric;

wherein the resonance frequencies of the P receiver antennas of each of the receiver antenna loop groups, in a sequence from an outermost receiver antenna toward an innermost receiver antenna, are not gradually increasing or gradually decreasing; and wherein each of the receiver antennas has a feeding end, and the feeding ends of the P receiver antennas of each of the receiver antenna loop groups are not adjacent to one another.

2. The display panel of claim 1, wherein the pixel structure further comprises a plurality of data lines, each of the receiver antennas is electrically connected to one of the data lines at the feeding end thereof, and each of the pixels in a same column of the M columns of the pixel array is connected to a same one of the data lines.

3. The display panel of claim 2, wherein the pixel structure comprises a black matrix area, and each of the receiver antennas is arranged to be substantially aligned to the black matrix area of the pixel structure along a vertical direction perpendicular to the pixel structure.

4. The display panel of claim 1, wherein for the P receiver antennas of each of the receiver antenna loop groups, the feeding ends of two of the P receiver antennas are located at different corners of the receiver antennas.

5. The display panel of claim 1, wherein for the P receiver antennas of each of the receiver antenna loop groups, the feeding end of one of the P receiver antennas is an outer feeding end, and the feeding end of another one of the P receiver antennas is an inner feeding end.

6. The display panel of claim 1, wherein P=4, and the four receiver antennas of each of receiver antenna loop groups comprises, in the sequence from the outermost receiver antenna toward the innermost receiver antenna:
a first receiver antenna;
a second receiver antenna;
a third receiver antenna;
a fourth receiver antenna;
wherein the resonance frequency of the first receiver antenna is less than the resonance frequencies of the second, third and fourth receiver antennas.

7. The display panel of claim 6, wherein the resonance frequency of the second receiver antenna is greater than the resonance frequency of one of the third and fourth receiver antennas, and is less than the resonance frequency of the other of the third and fourth receiver antennas.

8. The display panel of claim 6, wherein the feeding ends of the first, second, third and fourth receiver antennas are located at a same corner of the receiver antennas, and at least one of the feeding ends of the first, second, third and fourth receiver antennas is an outer feeding end, and at least one of the feeding ends of the first, second, third and fourth receiver antennas is an inner feeding end.

9. The display panel of claim 6, wherein the feeding ends of the first and third receiver antennas are located at a first corner of the receiver antennas, and the feeding ends of the second and fourth receiver antennas are located at a second corner of the receiver antennas.

10. The display panel of claim 6, wherein the feeding ends of the first and third receiver antennas are located at a first corner of the receiver antennas, the feeding end of the second receiver antenna is located at a second corner of the receiver antennas, and the feeding end of the fourth receiver antenna is located at a third corner of the receiver antennas.

11. A display panel, comprising:
a pixel structure corresponding to a display area, comprising a plurality of pixels arranged in an array having M columns and N rows, wherein M and N are positive integers;
a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and
a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas;
wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3;
wherein the P receiver antennas of each of the receiver antenna loop groups are arranged to be concentric;
wherein the resonance frequencies of the P receiver antennas of each of the receiver antenna loop groups, in a sequence from an outermost receiver antenna toward an innermost receiver antenna, are not gradually increasing or gradually decreasing; and
wherein each of the receiver antennas has a feeding end, and the feeding ends of the P receiver antennas of each of the receiver antenna loop groups are not adjacent to one another.

12. The display panel of claim 11, wherein the pixel structure further comprises a plurality of data lines, each of the receiver antennas is electrically connected to one of the data lines at the feeding end thereof, and each of the pixels in a same column of the M columns of the pixel array is connected to a same one of the data lines.

13. The display panel of claim 12, wherein the pixel structure comprises a black matrix area, and each of the receiver antennas is arranged to be substantially aligned to the black matrix area of the pixel structure along a vertical direction perpendicular to the pixel structure.

14. The display panel of claim 11, wherein for the P receiver antennas of each of the receiver antenna loop groups, the feeding ends of two of the P receiver antennas are located at different corners of the receiver antennas.

15. The display panel of claim 11, wherein for the P receiver antennas of each of the receiver antenna loop groups, the feeding end of one of the P receiver antennas is an outer feeding end, and the feeding end of another one of the P receiver antennas is an inner feeding end.

16. The display panel of claim 11, wherein the P receiver antennas of each of the transmitter antenna loop groups are arranged in a tile pattern.

17. A display panel, comprising:
   a pixel structure corresponding to a display area, comprising a plurality of pixels arranged in an array having M columns and N rows, wherein M and N are positive integers;
   a receiver antenna structure disposed on the pixel structure, configured to provide first signals to the pixels, wherein the receiver antenna structure comprises a plurality of receiver antennas, and each of the receiver antennas corresponds to at least one of the M columns and at least one of the N rows of the pixels and has a resonance frequency; and
   a transmitter antenna structure spatially separated from the receiver antenna structure, configured to transmit wireless signals to the receiver antenna structure such that the receiver antenna structure generates the first signals, wherein the transmitter antenna structure comprises a plurality of transmitter antennas, and each of the transmitter antennas one-to-one corresponds to one of the receiver antennas and has an identical resonance frequency to the resonance frequency of the corresponding one of the receiver antennas;
   wherein the receiver antennas are divided into a plurality of receiver antenna loop groups, and the transmitter antennas are correspondingly divided into a plurality of transmitter antenna loop groups, wherein each of the receiver antenna loop groups comprises P of the receiver antennas, each of the transmitter antenna loop groups comprises P of the transmitter antennas, and P is a positive integer greater than or equal to 3;
   wherein the P transmitter antennas of each of the transmitter antenna loop groups are arranged to be concentric;
   wherein the resonance frequencies of the P transmitter antennas of each of the transmitter antenna loop groups, in a sequence from an outermost transmitter antenna toward an innermost transmitter antenna, are not gradually increasing or gradually decreasing; and
   wherein each of the receiver antennas has a feeding end, and the feeding ends of the P receiver antennas of each of the receiver antenna loop groups are not adjacent to one another.

18. The display panel of claim 17, wherein the pixel structure further comprises a plurality of data lines, each of the receiver antennas is electrically connected to one of the data lines at the feeding end thereof, and each of the pixels in a same column of the M columns of the pixel array is connected to a same one of the data lines.

19. The display panel of claim 18, wherein the pixel structure comprises a black matrix area, and each of the receiver antennas is arranged to be substantially aligned to the black matrix area of the pixel structure along a vertical direction perpendicular to the pixel structure.

20. The display panel of claim 17, wherein the P receiver antennas of each of the receiver antenna loop groups are arranged in a tile pattern.

* * * * *